(12) United States Patent
Lundquist et al.

(10) Patent No.: US 12,537,497 B2
(45) Date of Patent: *Jan. 27, 2026

(54) INDUCTIVE-CAPACITIVE FILTERS AND ASSOCIATED SYSTEMS AND METHODS

(71) Applicant: WJLP COMPANY INC., Stockton, CA (US)

(72) Inventors: Weyman John Lundquist, Berkeley, CA (US); Mary Elizabeth Clark, Manteca, CA (US)

(73) Assignee: WJLP COMPANY INC., Stockton, CA (US)

( * ) Notice: Subject to any disclaimer, the term of this patent is extended or adjusted under 35 U.S.C. 154(b) by 179 days.

This patent is subject to a terminal disclaimer.

(21) Appl. No.: 18/519,421

(22) Filed: Nov. 27, 2023

(65) Prior Publication Data

US 2024/0106405 A1   Mar. 28, 2024

Related U.S. Application Data

(63) Continuation of application No. 17/532,987, filed on Nov. 22, 2021, now Pat. No. 11,831,290, which is a
(Continued)

(51) Int. Cl.
*H03H 1/00*   (2006.01)

(52) U.S. Cl.
CPC ....... *H03H 1/00* (2013.01); *H03H 2001/0014* (2013.01); *H03H 2001/0042* (2013.01);
(Continued)

(58) Field of Classification Search
CPC ... H03H 2001/0014; H03H 2001/0021; H03H 2001/0035; H03H 2001/0042; H03H 2001/005; H03H 2001/0092
(Continued)

(56) References Cited

U.S. PATENT DOCUMENTS

| 2,027,067 A | 1/1936 | Kurt |
| 2,884,605 A | 4/1959 | William |

(Continued)

FOREIGN PATENT DOCUMENTS

| CN | 2472352 Y | 1/2002 |
| EP | 2835148 A1 | 2/2015 |

(Continued)

OTHER PUBLICATIONS

Communication Pursuant to Article 94(3) EPC issued in European Application No. 18837308.8, dated Apr. 1, 2022, 5 pages.
(Continued)

*Primary Examiner* — Hai L Nguyen
(74) *Attorney, Agent, or Firm* — Cozen O'Connor

(57) ABSTRACT

An inductive-capacitive filter includes a first insulating-conductive strip wound around a winding axis, where the first insulating-conductive strip includes a first conductive strip joined with a first insulating strip. An inductive-capacitive filter assembly includes a first and a second insulating-conductive strip concentrically wound around a winding axis, the first insulating-conductive strip including a first conductive strip joined with a first insulating strip, and the second insulating-conductive strip including a second conductive strip joined with a second insulating strip.

15 Claims, 32 Drawing Sheets

Related U.S. Application Data continuation of application No. 16/633,409, filed as application No. PCT/US2018/043651 on Jul. 25, 2018, now Pat. No. 11,183,985.

(60) Provisional application No. 62/536,806, filed on Jul. 25, 2017.

(52) U.S. Cl.
CPC ............... *H03H 2001/005* (2013.01); *H03H 2001/0092* (2013.01)

(58) Field of Classification Search
USPC .................................... 333/167; 327/551–559
See application file for complete search history.

(56) References Cited

U.S. PATENT DOCUMENTS

| | | | |
|---|---|---|---|
| 3,911,332 | A | 10/1975 | Kunkel |
| 4,048,593 | A | 9/1977 | Zillman |
| 4,847,575 | A | 7/1989 | Ikeda |
| 4,945,322 | A | 7/1990 | Okumura |
| 5,153,812 | A | 10/1992 | Naito |
| 5,337,028 | A | 8/1994 | White |
| 6,208,225 | B1 | 3/2001 | Miller |
| 6,476,689 | B1 | 11/2002 | Uchida et al. |
| 11,183,985 | B2 | 11/2021 | Lundquist et al. |
| 11,831,290 | B2 * | 11/2023 | Lundquist ............... H03H 1/00 |
| 2012/0038434 | A1 | 2/2012 | Harrison |

FOREIGN PATENT DOCUMENTS

| | | | |
|---|---|---|---|
| GB | 2250392 | A | 6/1992 |
| JP | H05121987 | A | 5/1993 |
| JP | H07336138 | A | 12/1995 |
| JP | H0817131 | B2 | 2/1996 |
| JP | H08162367 | A | 6/1996 |
| JP | 2728439 | B2 | 3/1998 |
| JP | 2004235911 | A | 8/2004 |
| JP | 2007067800 | A | 3/2007 |

OTHER PUBLICATIONS

Extended European Search Report for European Application No. 18837308.8 mailed on Sep. 23, 2021, 7 pages.
Extended European Search Report for European Application No. 23163386.8 dated Jul. 10, 2023, 7 pages.
International Search Report and Written Opinion for PCT/US2018/043651 dated Oct. 15, 2018, 10 pages.
Non Final Office Action for U.S. Appl. No. 16/633,409, mailed Jan. 7, 2021, 17 pages.
Non Final Office Action for U.S. Appl. No. 17/532,987, mailed Jan. 23, 2023, 7 pages.
Notice of Reasons for Rejection dated Aug. 9, 2022, for Japanese Patent Application No. 2020-527840, 6 pages.
Notice of Reasons for Rejection dated Jan. 18, 2022, for Japanese Patent Application No. 2020-527840, 7 pages.
Notice of Reasons for Rejection dated Mar. 19, 2024, for Japanese Patent Application No. 2023-022186, 10 pages.

* cited by examiner

INDUCTIVE-CAPACITIVE FILTERS AND ASSOCIATED SYSTEMS AND METHODS

RELATED APPLICATIONS

This application is a continuation of U.S. patent application Ser. No. 17/532,987, filed Nov. 22, 2021, now U.S. Pat. No. 11,831,290 B2 issued on Nov. 28, 2023, which is a continuation of U.S. patent application Ser. No. 16/633,409, filed Jan. 23, 2020, now U.S. Pat. No. 11,183,985, which is a § 371 national stage of International Patent Application No. PCT/US2018/043651, filed Jul. 25, 2018, which claims benefit of priority to U.S. Provisional Patent Application Ser. No. 62/536,806, filed Jul. 25, 2017, each of which is incorporated herein by reference.

BACKGROUND

Selective electrical signal elimination is often critical to stable and reliable operation of equipment that delivers high power radio frequency (RF) electrical signals, such as electrical signals between 10 kilohertz (kHz) and 1 gigahertz (GHz). In some applications electrical signals must be removed within a specified bandwidth, necessitating use of a bandstop filter which blocks electrical signals having frequencies within a certain frequency band while transmitting electrical signals or electrical energy outside of the frequency band. Additionally, some applications require electrical energy to be delivered to multiple loads having the same or different selective signal elimination requirements. These multi-load applications require a bandstop filter for each load, where each bandstop filter is tuned for its specific load, and where each bandstop filter does not significantly interfere with each other bandstop filter.

A bandstop filter ideally has high impedance at a specified frequency band to block signals within the specified frequency band, while having low impedance outside of the frequency band to prevent undesired signal attenuation and/or inefficient delivery of electrical energy. A filter's signal attenuation as a function of signal frequency may be referred to as the filter's bandstop characteristics. Bandstop filters are conventionally constructed from two or more discrete components, such as a discrete inductor and a discrete capacitor placed in a parallel configuration in an electrical circuit. The discrete inductor is typically formed of copper or aluminum wire wound in a coil, and the coil is optionally wound around a magnetic core. The discrete capacitor is typically formed of two metal plates with a dielectric material in between the two metal plates. The dielectric material can be ceramic, glass, mica, plastic film, or metal oxide.

SUMMARY

In an embodiment, an inductive-capacitive filter includes a first insulating-conductive strip wound around a winding axis, where the first insulating-conductive strip includes a first conductive strip joined with a first insulating strip.

In an embodiment, the first conductive strip is wound in parallel with the first insulating strip around the winding axis.

In an embodiment, the first conductive strip is formed of metallic foil, and the first insulating strip is formed of dielectric material.

In an embodiment, the first conductive strip has a cross-sectional area with an aspect ratio of at least 2.

In an embodiment, the first insulating-conductive strip forms an inner aperture, as seen when the inductive-capacitive filter is viewed cross-sectionally along a direction of the winding axis.

In an embodiment, the inner aperture has a non-circular shape.

In an embodiment, the inductive-capacitive filter further includes a magnetic core disposed in the inner aperture.

In an embodiment, the inductive-capacitive filter further includes first and second terminals electrically coupled to opposing first and second ends of the first conductive strip, respectively.

In an embodiment, the inductive-capacitive filter further includes one or more additional insulating-conductive strips wound around the winding axis, each additional insulating-conductive strip including a respective conductive strip wound with a respective insulating strip.

In an embodiment, a inductive-capacitive filter assembly includes a first and a second insulating-conductive strip concentrically wound around a winding axis, the first insulating-conductive strip including a first conductive strip joined with a first insulating strip, and the second insulating-conductive strip including a second conductive strip joined with a second insulating strip.

In an embodiment, the first conductive strip is wound in parallel with the first insulating strip around the winding axis, and the second conductive strip is wound in parallel with the second insulating strip around the winding axis.

In an embodiment, the first insulating-conductive strip is electrically coupled to the second insulating-conductive strip.

In an embodiment, the first insulating-conductive strip is disposed within the second insulating-conductive strip, as seen when the inductive-capacitive filter assembly is viewed cross-sectionally along a direction of the winding axis.

In an embodiment, the inductive-capacitive filter assembly further includes a third insulating-conductive strip concentrically wound with the first and second insulating-conductive strips around the winding axis. The third insulating-conductive strip includes a third conductive strip joined with a third insulating strip, and each of the first, second, and third insulating-conductive strips form a respective inductive-capacitive filter. The first insulating-conductive strip is disposed within the second insulating-conductive strip, as seen when the inductive-capacitive filter assembly is viewed cross-sectionally along a direction of the winding axis, and each of the first and second insulating conductive strips is disposed within the third insulating-conductive strip, as seen when the inductive-capacitive filter assembly is viewed cross-sectionally along the direction of the winding axis.

In an embodiment, each of the first and second conductive strips is formed of metallic foil, and each of the first and second insulating strips is formed of dielectric material.

In an embodiment, the first conductive strip has a cross-sectional area with an aspect ratio of at least 2, and the second conductive strip has a cross-sectional area with an aspect ratio of at least 2.

In an embodiment, each of the first and second insulating-conductive strips forms multiple turns around the winding axis.

In an embodiment, each of the first and second insulating-conductive strips forms a different respective number of turns around the winding axis.

In an embodiment, the inductive-capacitive filter assembly further includes a third insulating-conductive strip concentrically wound with the first and second insulating-conductive strips around the winding axis. The third insulating-conductive strip includes a third conductive strip joined with a third insulating strip, and each of the first, second, and third insulating-conductive strips forming a respective inductive-capacitive filter.

In an embodiment, an electrical circuit includes any of the above-disclosed inductive-capacitive filters.

In an embodiment, opposing first and second ends of the first conductive strip are electrically coupled to different respective nodes of the electrical circuit.

In an embodiment, the electrical circuit further includes a load and at least one of an alternating current electrical power source and a direct current electrical power source electrically coupled in series with the inductive-capacitive filter of the electrical circuit.

In an embodiment, an electrical circuit includes any one of the above-disclosed inductive capacitive filter assemblies, and each of the first and second insulating-conductive strips are electrically coupled to respective branches of the electrical circuit.

In an embodiment, each of the first and second insulating-conductive strips is electrically coupled between an electrical power source and a respective electrical load.

DETAILED DESCRIPTION OF THE EMBODIMENTS

Conventional bandstop filters can generally achieve acceptable bandstop characteristics with careful design and construction. However, the discrete components forming conventional bandstop filters often cause the filters to be large, costly, and difficult to construct, especially for high power applications. Additionally, impedance of wire forming discrete inductors of conventional bandstop filters may significantly limit maximum current capability of the filters, especially at high operating frequencies where the skin-effect, i.e., tendency for high-frequency current to crowd near outer surfaces of the wire, is significant. Furthermore, it can be difficult to achieve precise bandstop characteristics in conventional bandstop filters due to parasitic effects, including parasitic inductance and parasitic capacitance of discrete components forming conventional bandstop filters.

Applicant has developed inductive-capacitive filters and associated assemblies which potentially overcome one or more of the above-discussed drawbacks associated with conventional bandstop filters. Certain embodiments do not require discrete inductors or discrete capacitors, thereby promoting small filter size, low filter cost, and ease of filter manufacturing. Additionally, certain embodiments can be readily tuned to achieve desired bandstop characteristics during filter design and/or manufacturing, thereby achieving precise bandstop characteristics and potentially minimizing the number of base filter designs required to support varying applications. Furthermore, particular embodiments achieve relatively low-impedance at low and high frequencies outside a predetermined frequency band, thereby helping minimize resistive losses. Moreover, some embodiments form multiple LC filters in a single package.

Figure 1:
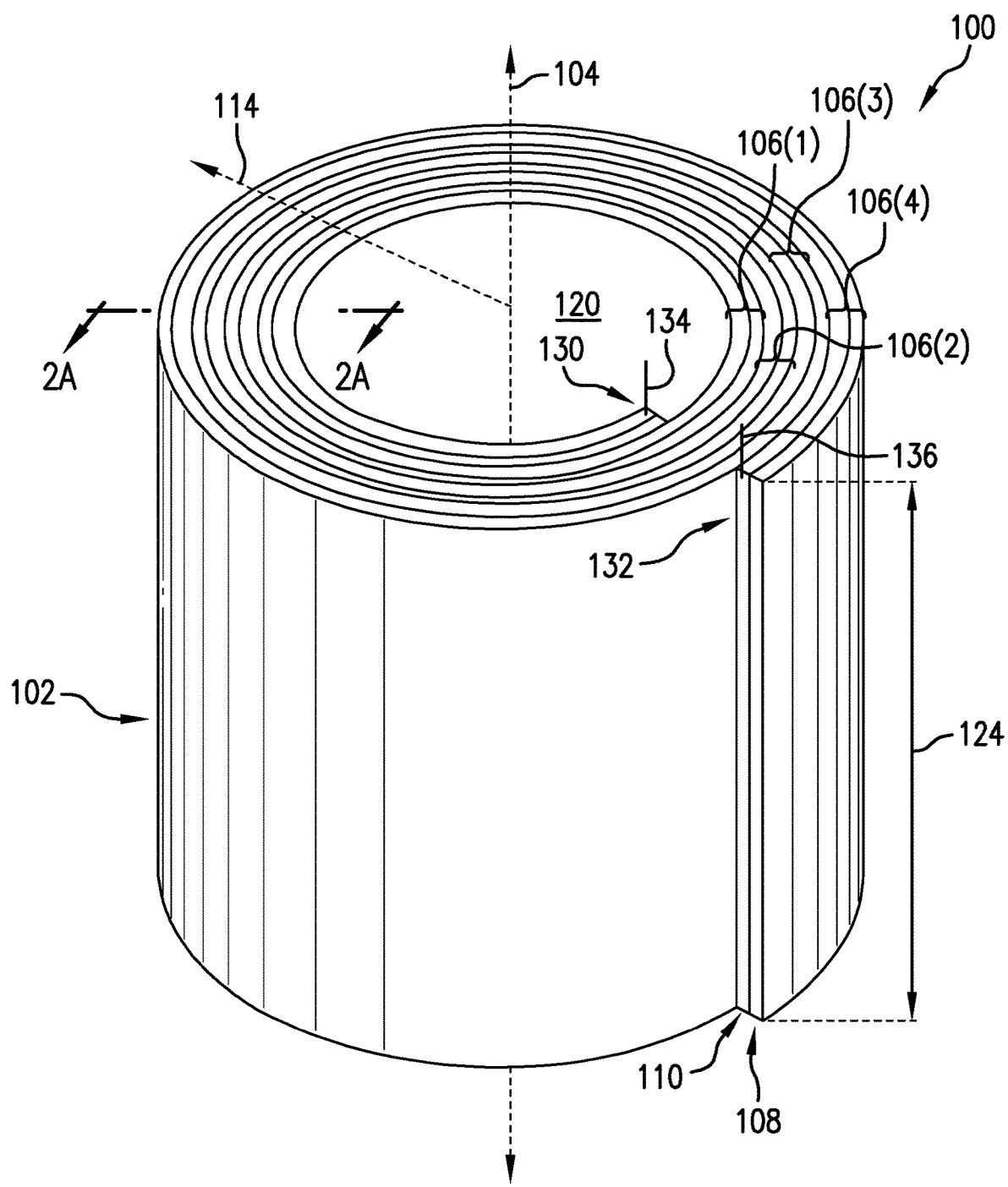
FIG. 1 is a perspective view of an inductive-capacitive-filter, according to an embodiment.
Figure 2:
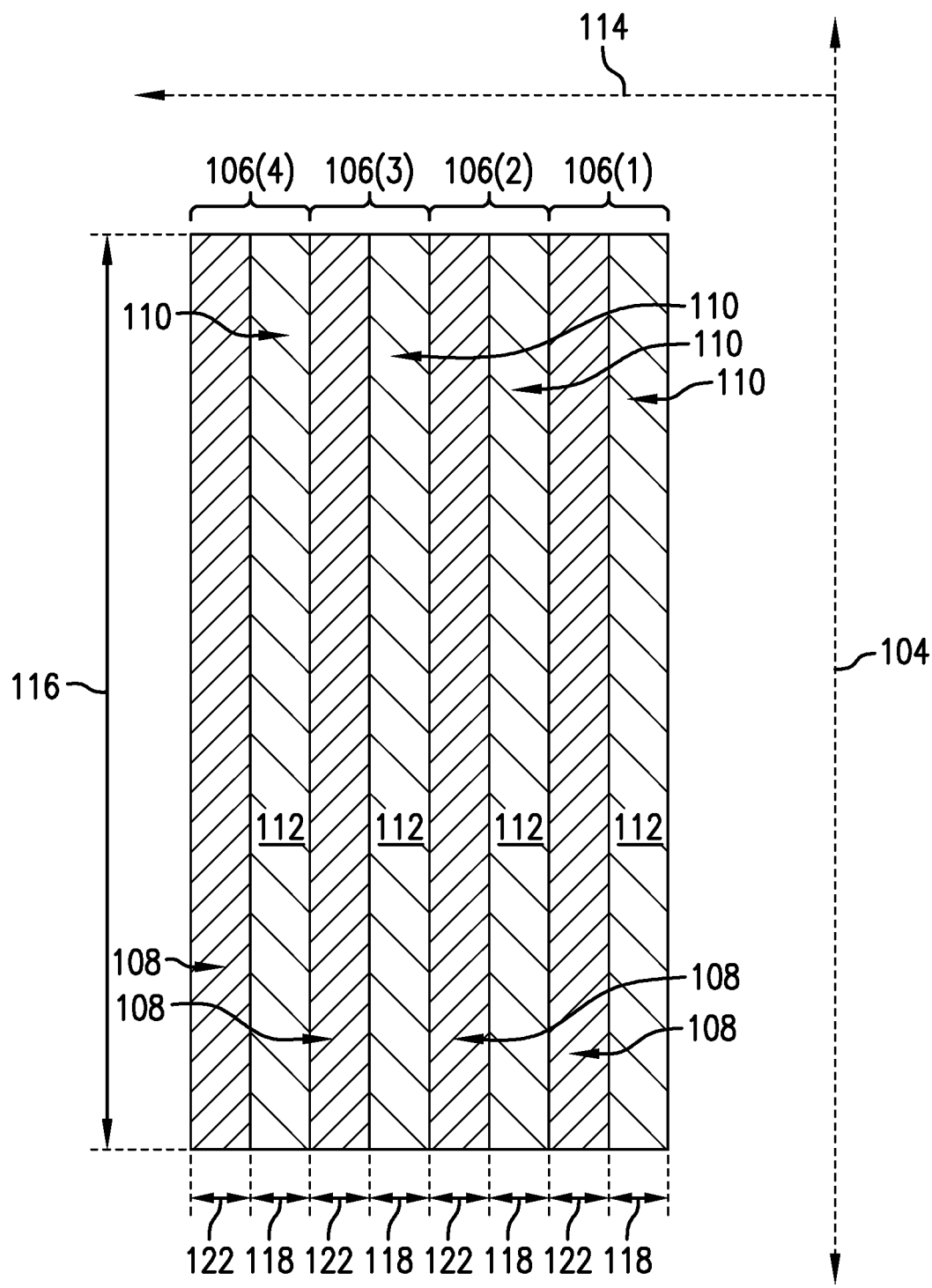
FIG. 2 is a cross-sectional view of the FIG. 1 inductive-capacitive-filter.

FIG. 1 is a perspective view of an inductive-capacitive filter 100, which is one embodiment of the new inductive-capacitive filters developed by Applicant. Inductive-capacitive filter 100 includes an insulating strip 108 and a conductive strip 110, collectively referred to as insulating-conductive strip 102, wound around a winding axis 104 to form a plurality of turns 106. In this document, specific instances of an item may be referred to by use of a numeral in parentheses (e.g., turn 106(1)) while numerals without parentheses refer to any such item (e.g., turns 106). Although inductive-capacitive filter 100 is illustrated as having four turns 106, the number of turns may be varied, including whole or partial turns, without departing from the scope hereof. Conductive strip 110 is joined with an insulating strip 108, such that conductive strip 110 is wound in parallel with insulating strip 108 around winding axis 104. FIG. 2 is a cross-sectional view of inductive-capacitive filter 100 taken along line 2A-2A of FIG. 1. Insulating strip 108 is formed, for example, of a non-conductive, dielectric insulating material such as nomex, Kapton, mylar paper, or any other material which will provide electrical isolation between conductive strips 110. Conductive strip 110 is formed, for example, of a metallic foil, such as aluminum foil, copper foil, or any other material with a low electrical resistivity. In certain embodiments, insulating strip 108 and conductive strip 110 are separately formed and are wound together to form insulating-conductive strip 102, while in some other embodiments, insulating strip 108 and conductive strip 110 are bonded together before the resultant insulating-conductive strip 102 is wound around winding axis 104. For example, in a particular embodiment, insulating strip 108 is formed on conductive strip 110 using a film deposition technique before the resulting insulating-conductive strip 102 is wound around winding axis 104.

Conductive strip 110 has opposing first and second ends 130 and 132, respectively. A first terminal 134 is electrically coupled to first end 130, and a second terminal 136 is electrically coupled to second end 132. First and second terminals 134 and 136 provide electrical interface to inductive-capacitive filter 100. In some embodiments, first and second terminals 134 and 136 include a respective aluminum or copper buss bar or wire soldered to conductive strip 110. First and second terminals 134 and 136 could be omitted without departing from the scope hereof.

Conductive strip 110 has a cross-sectional area 112 when viewed in a plane parallel to each of winding axis 104 and a radial axis 114. Radial axis 114 is orthogonal to winding axis 104 and extends away from winding axis 104. Cross-sectional area 112 has an aspect ratio of width 116 divided by thickness 118, where width 116 is a width of conductive strip 110 parallel to winding axis 104 and thickness 118 is a thickness of conductive strip 110 parallel to radial axis 114. In certain embodiments, the aspect ratio is at least 2, i.e., width 116 is at least twice thickness 118, to minimize the skin-effect and proximity effects when conductive strip 110 is carrying high-frequency signals. As discussed above, the skin-effect describes the tendency of high frequency current to crowd near outer surfaces of a conductor, while the proximity effect describes a magnetic field generated by current flowing through one conductor inducing a circulating current through one or more nearby other conductors. In a particular embodiment, thickness 118 is 0.10 inch or less and width 116 is at least 0.5 inch or more to achieve a large cross-sectional area 112, thereby promoting low AC resistance and low DC resistance at frequencies outside of a bandstop filter frequency band of inductive-capacitive filter 100.

Figure 3:
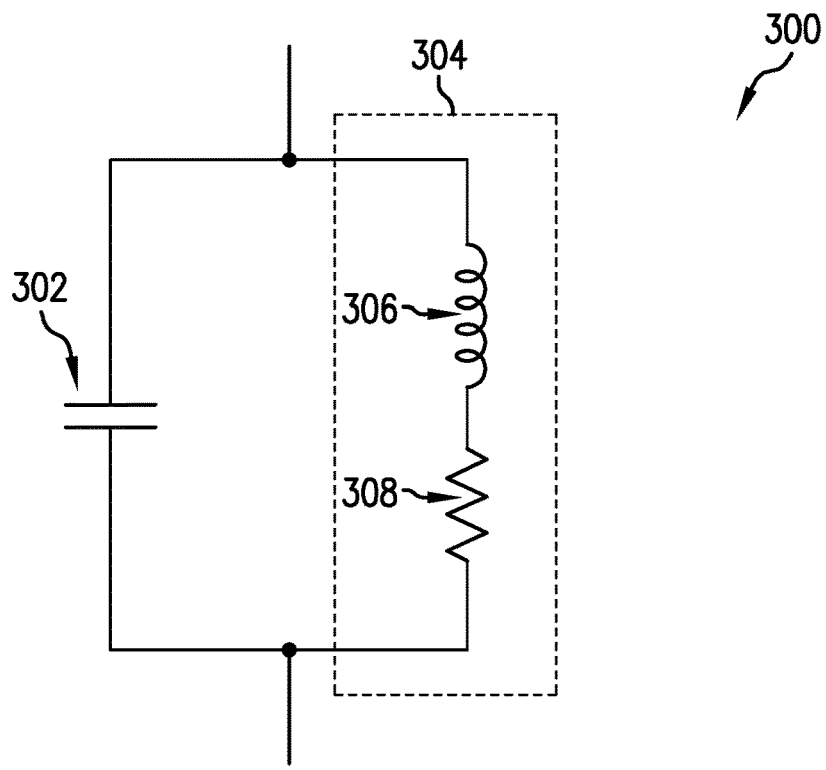
FIG. 3 illustrates an approximate electrical model of the FIG. 1 inductive-capacitive-filter.

Adjacent portions of conductive strip 110 create capacitance, and conductive strip 110 creates inductance when connected to an electrical circuit. Consequently, inductive-capacitive filter 100 has electrical characteristics of a parallel inductive-capacitive filter. FIG. 3 illustrates an approximate electrical model 300 of inductive-capacitive filter 100 as seen from first and second terminals 134 and 136, where a capacitor 302 is electrically coupled in parallel with an inductive branch 304. Inductive branch 304 includes an inductor 306 electrically coupled in series with a resistor 308. Capacitor 302 represents capacitance of adjacent portions of conductive strip 110, inductor represents 306 inductance of conductive strip 110, and resistor 308 represents resistance of conductive strip 110. Accordingly, inductive-capacitive filter 100 is capable of operating as a bandstop filter without use of a discrete inductor or a discrete capacitor, thereby promoting small filter size, low filter cost, and ease of filter manufacturing. Inductive-capacitive filter 100 has a resonant frequency $f_o$, i.e. a frequency at which the filter has a peak impedance, approximately as follows, where L is inductance of inductor 306, and C is capacitance of capacitor 302.

$$f_0 = 1/2\pi\sqrt{LC} \qquad \text{EQN. 1}$$

Figure 4:
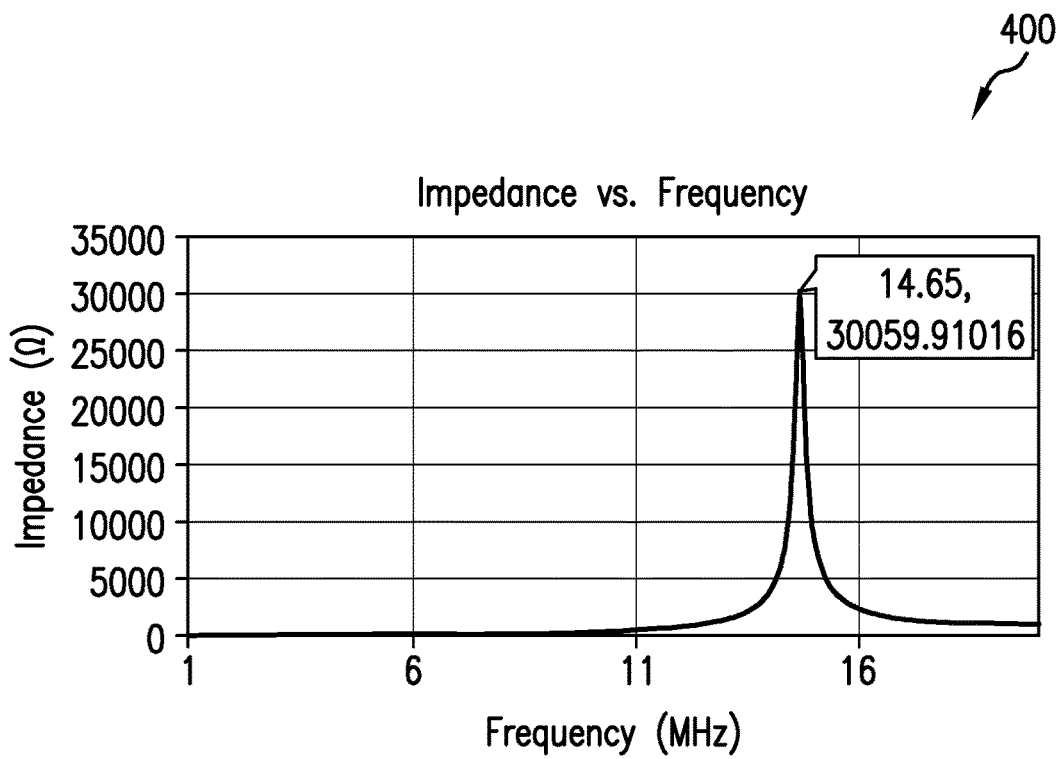
FIG. 4 is a graph of impedance versus frequency of one particular embodiment of the FIG. 1 inductive-capacitive filter.

FIG. 4 is a graph 400 of impedance versus frequency of one particular embodiment of inductive-capacitive filter 100. As evident from FIG. 4, this particular embodiment has a resonant frequency of about 14.65 megahertz (MHz), and impedance of the filter is approximately 30,000 ohms at the resonant frequency. Impedance rapidly decreases when frequency moves away from the resonant frequency, such that the inductive-capacitive filter has a low impedance at frequencies away from the resonant frequency, to help minimize undesired signal attenuation.

It should be noted that although electrical model 300 of FIG. 3 illustrates each of capacitor 302, inductor 306, and resistor 308 as being a discrete element for illustrative simplicity, each of these components represents a distributed element. Additionally, it should be noted that model 300 does not account for high-order effects, such as a leakage current through capacitor 302. It is anticipated that inductive-capacitive filter 100 will typically be designed to promote small resistance of conductive strip 110 to minimize resistive losses in inductive-capacitive filter 100, although conductive strip 110 could be designed to achieve a finite resistance, such as in applications where a particular resistive damping is desired.

Figure 5:
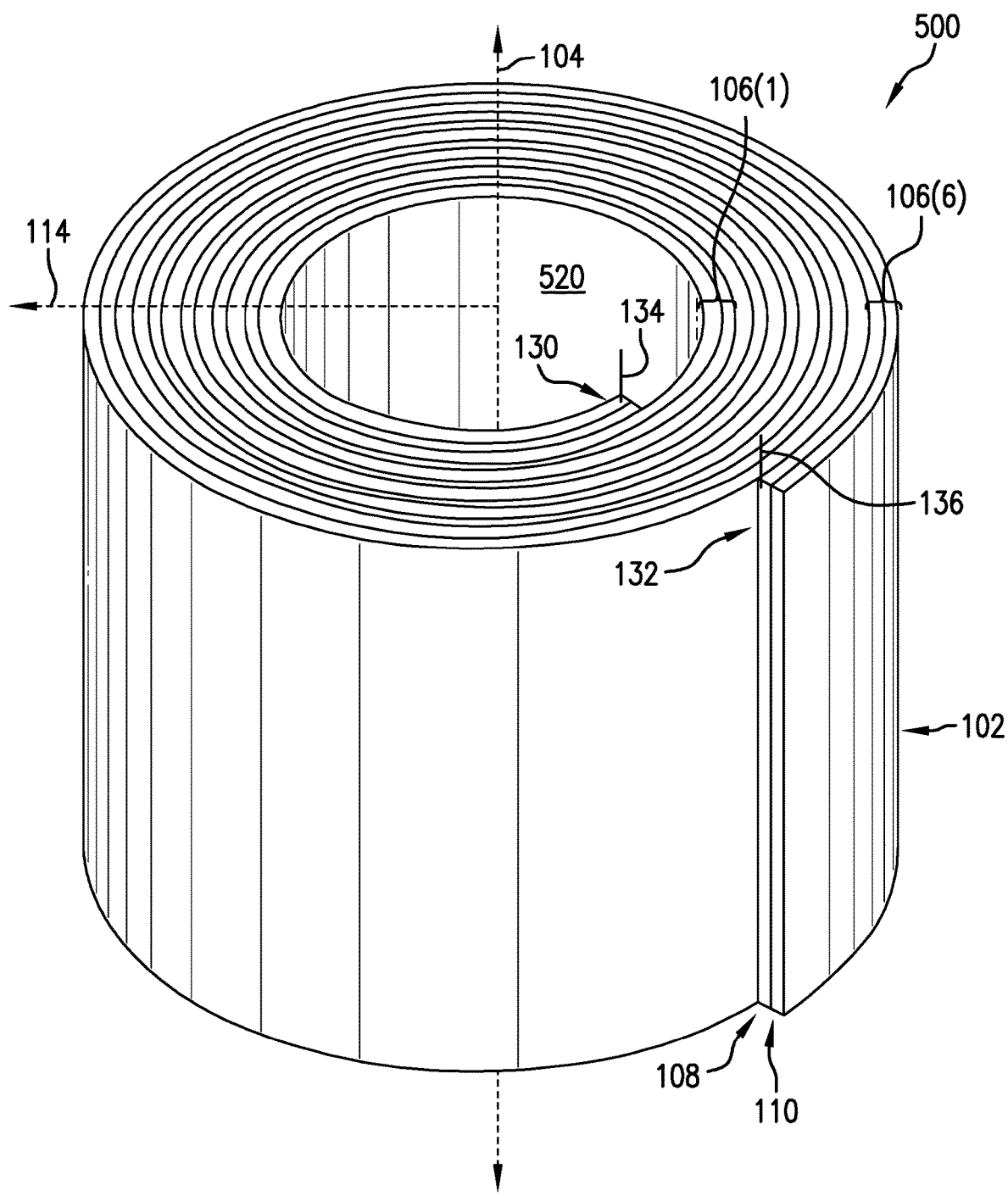
FIG. 5 is a perspective view of an inductive-capacitive filter which is like the FIG. 1 inductive-capacitive filter but has six turns instead of four turns, according to an embodiment.

The resonant frequency of inductive-capacitive filter 100 may be varied during its design and/or manufacture, thereby enabling precise bandstop characteristics to be achieved and/or a single base design to support numerous applications. For example, the resonant frequency of inductive-capacitive filter 100 may be varied by varying the number of turns 106 formed around winding axis 104. In particular, increasing the number of turns 106 increases inductance of inductive-capacitive filter 100, and increasing inductance lowers the resonant frequency of inductive-capacitive filter 100, as can be determined from EQN. 1 above. FIG. 5 is a perspective view of an inductive-capacitive filter 500 which is like inductive-capacitive filter 100 of FIG. 1 but having six turns 106 instead of four turns 106. Accordingly, inductive-capacitive filter 500 will have a lower resonant frequency than inductive-capacitive filter 100. Only two instances of turns 106 are labeled in FIG. 5 to promote illustrative clarity. It should be noted that each turn 106 need not necessarily be a complete turn, or in other words, the first and/or last turn 106 could be a partial turn, which enables bandstop characteristics to be continuously varied during the design and/or manufacture of inductive-capacitive filter 100.

Figure 6:
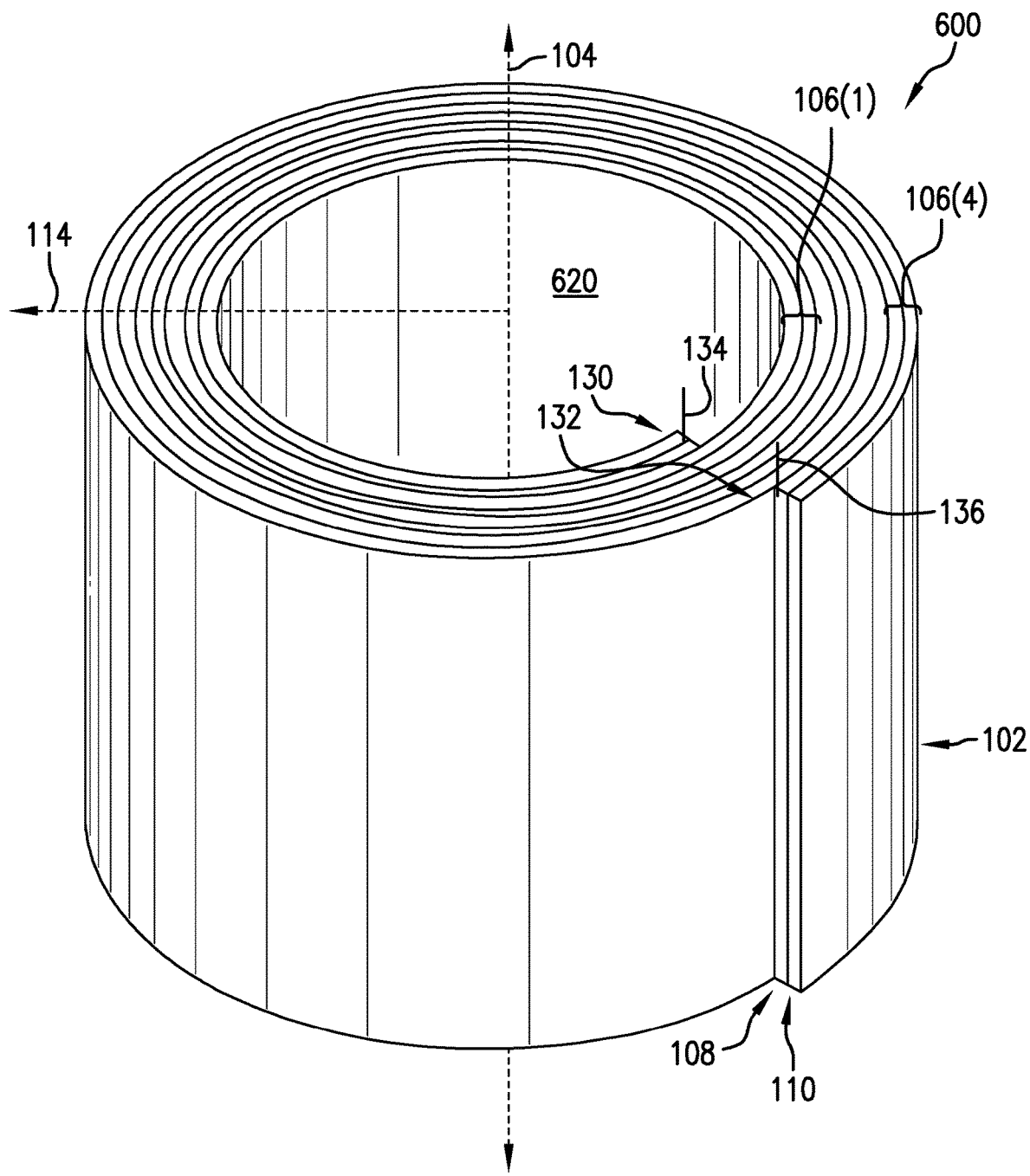
FIG. 6 is a perspective view of an inductive-capacitive filter which is like the FIG. 1 inductive-capacitive filter but has a larger inner aperture, according to an embodiment.

Insulating-conductive strip 102 forms an inner aperture 120 and 520 in each of inductive-capacitive filters 100 and 500, respectively, as seen when viewed cross-sectionally along a direction of winding axis 104. Bandstop characteristics of capacitive filters 100 and 500 can be varied by varying the size and/or shape of inner aperture 120 and 520, in addition to or in place of varying the number of turns 106. For example, FIG. 6 is a perspective view of an inductive-capacitive filter 600 which is like inductive-capacitive filter 100 of FIG. 1 but having an inner aperture 620 that is larger than inner aperture 120, as seen when viewed cross-sectionally along a direction of winding axis 104. Increasing inner aperture size increases cross-sectional area of magnetic flux paths, which increases inductance. Such increase in inductance decreases the resonant frequency and increases impedance at the resonant frequency. Consequently, inductive-capacitive filter 600 will have a lower resonant frequency and higher peak impedance than inductive-capacitive filter 100.

Figure 7:
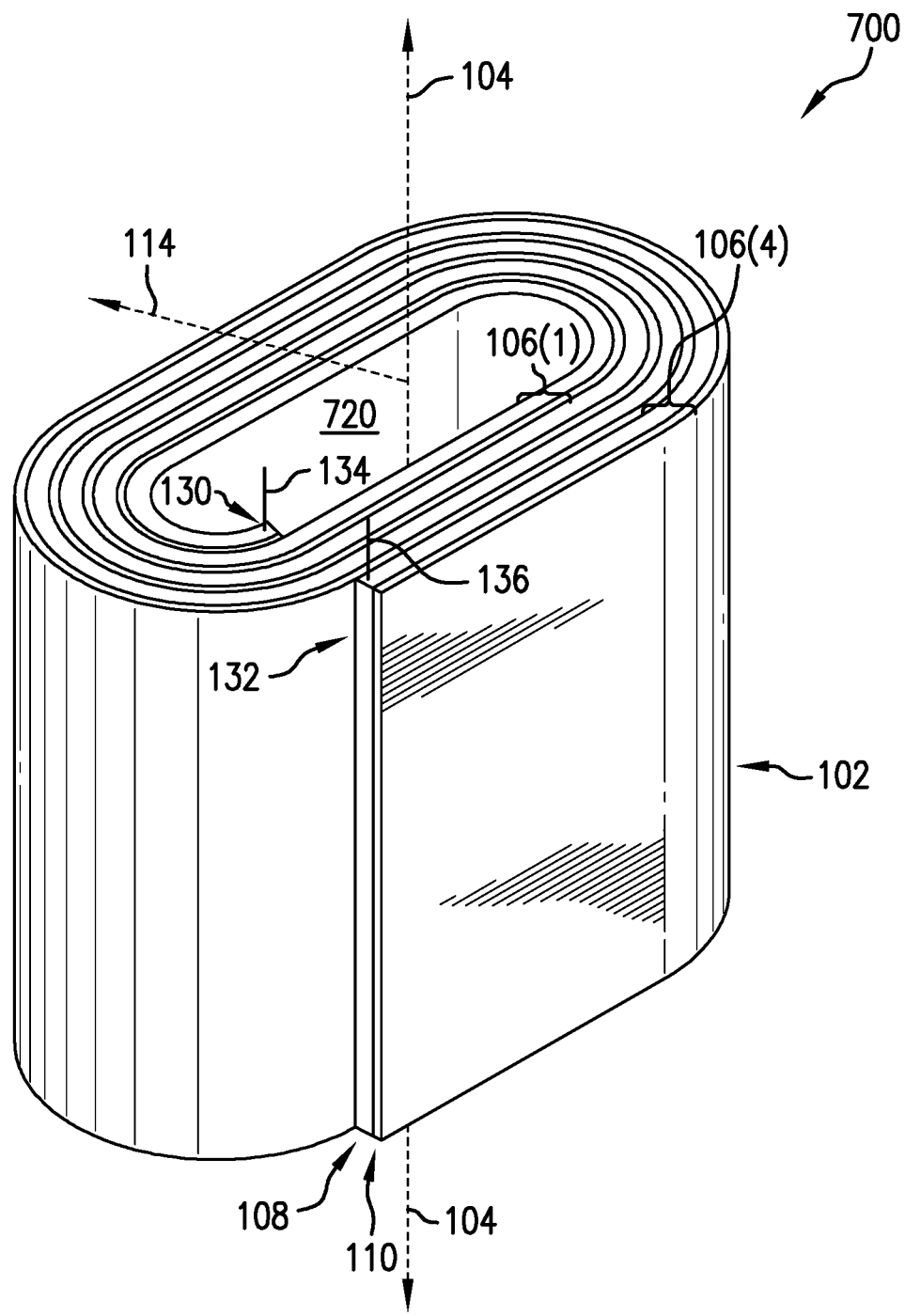
FIG. 7 is a perspective view of an inductive-capacitive filter which is like the FIG. 1 inductive-capacitive filter but has an inner aperture with an oval shape, according to an embodiment.

As another example, FIG. 7 is a perspective view of an inductive-capacitive filter 700 which is like inductive-capacitive filter 100 of FIG. 1 but having an inner aperture 720 that has an oval shape instead of a circular shape, as seen when viewed cross-sectionally along a direction of winding axis 104. Although inner aperture 720 has the same circumference as inner aperture 120 of FIG. 1, inner aperture 720 has a smaller area than inner aperture 120, as seen when viewed cross-sectionally along a direction of winding axis 104. As a result, inductive-capacitive filter 700 will have a higher resonant frequency and smaller peak impedance than inductive-capacitive filter 100. Any of the inductive-capacitive filters disclosed herein could be varied to have a different inner aperture shape without departing from the scope hereof. For example, inductive-capacitive filter 700 could be modified such that inner aperture 720 has a different non-circular shape, such as a rectangular shape, a triangular shape, or even an irregular shape.

Figure 8:
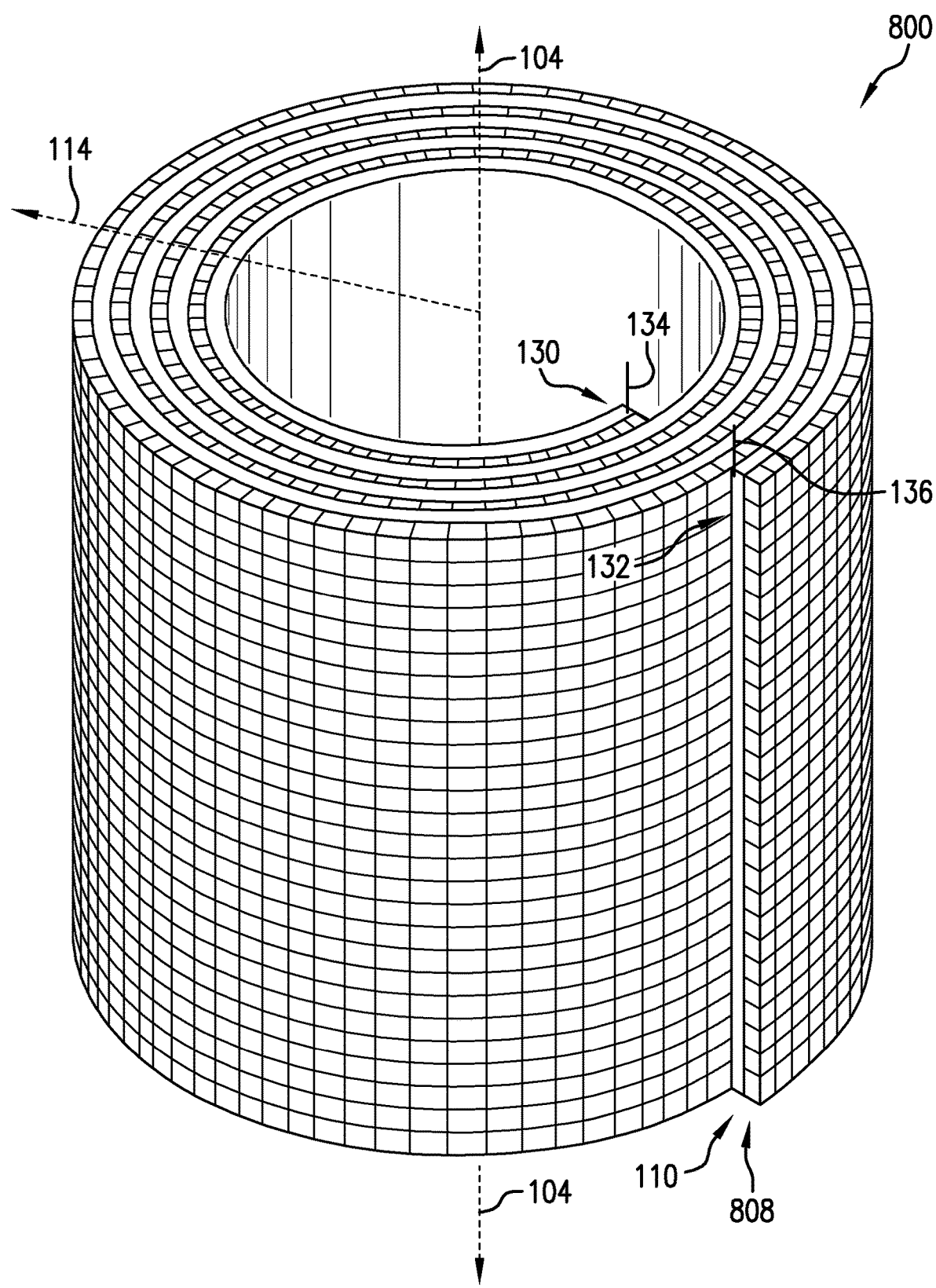
FIG. 8 is a perspective view of an inductive-capacitive filter which is like the FIG. 1 inductive-capacitive filter but with a different insulating strip, according to an embodiment.

The material and/or thickness of insulating strip 108 could be modified in any of the inductive-capacitive filters disclosed herein, such as to tune bandstop characteristics. Increasing the dielectric constant of insulating strip 108 decreases both the resonant frequency value and the peak impedance of the inductive-capacitive filter. For example, FIG. 8 is a perspective view of an inductive-capacitive filter 800 which is like inductive-capacitive filter 100 of FIG. 1 but with insulating strip 108 replaced with an insulating strip 808. Insulating strip 808 has a greater dielectric constant than insulating strip 108. As a result, inductive-capacitive filter 800 will have a lower resonant frequency and smaller peak impedance than inductive-capacitive filter 100. On the other hand, replacing insulating strip 108 with an insulating strip having a lower dielectric constant than insulating strip 108 would increase resonant frequency and peak impedance of inductive-capacitive filter 100.

Figure 9:
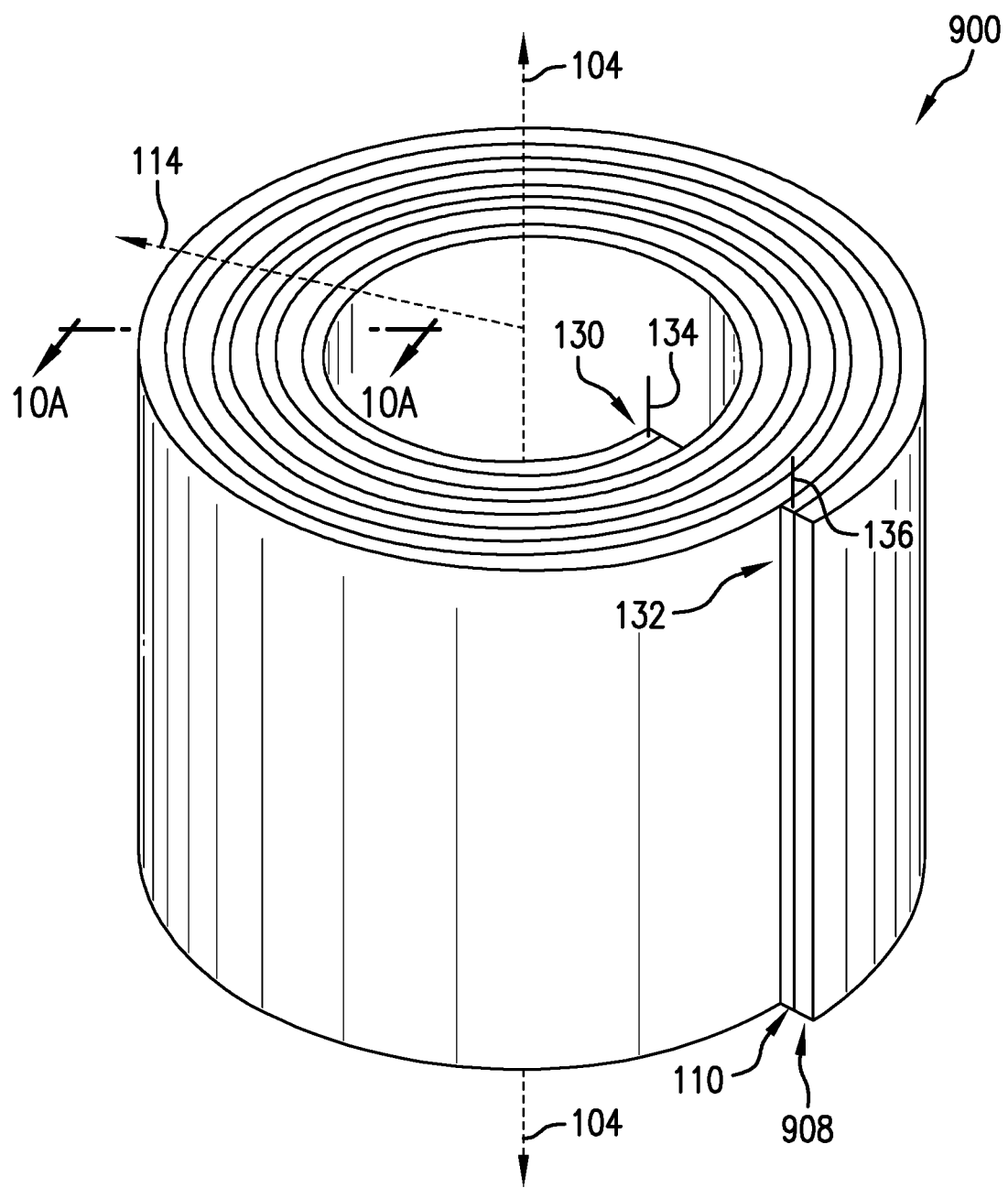
FIG. 9 is a perspective view of an inductive-capacitive filter which is like the FIG. 1 inductive-capacitive filter but has a thicker insulating strip, according to an embodiment.
Figure 10:
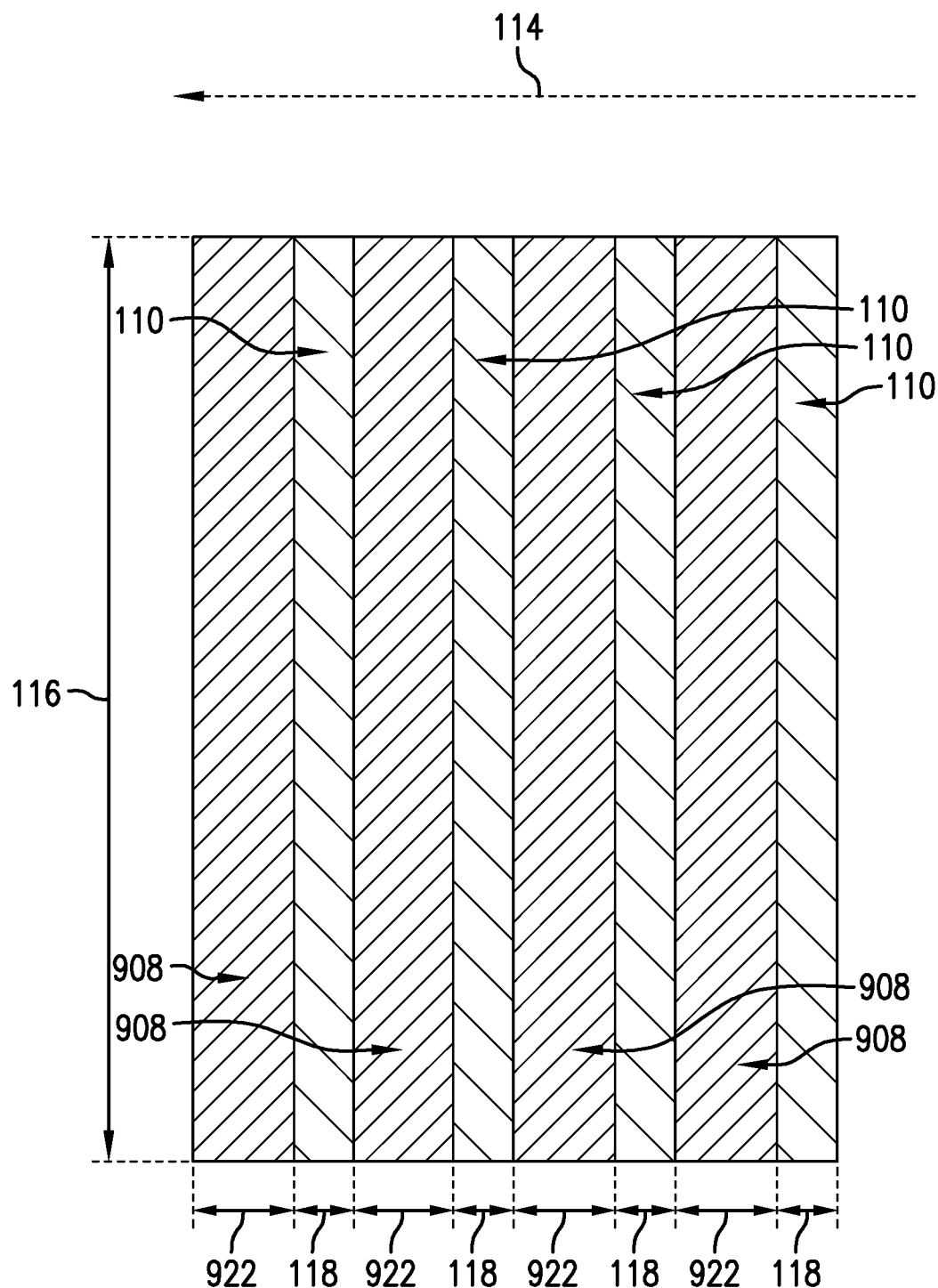
FIG. 10 is a cross-sectional view of the FIG. 9 inductive-capacitive-filter.

Increasing thickness 122 (FIG. 2) of insulating strip 108 increases both the resonant frequency value and the peak impedance of the inductive-capacitive filter. For example, FIG. 9 is a perspective view of an inductive-capacitive filter 900 which is like inductive-capacitive filter 100 of FIG. 1 but with insulating strip 108 replaced with insulating strip 908. FIG. 10 is a cross-sectional view of inductive-capacitive filter 900 taken along line 10A-10A of FIG. 9. Insulating strip 908 has a thickness 922 that is greater than thickness 122 of insulating strip 108. As a result, inductive-capacitive filter 900 will have a lower capacitance, higher resonant frequency, and greater maximum impedance than inductive-capacitive filter 100.

Figure 11:
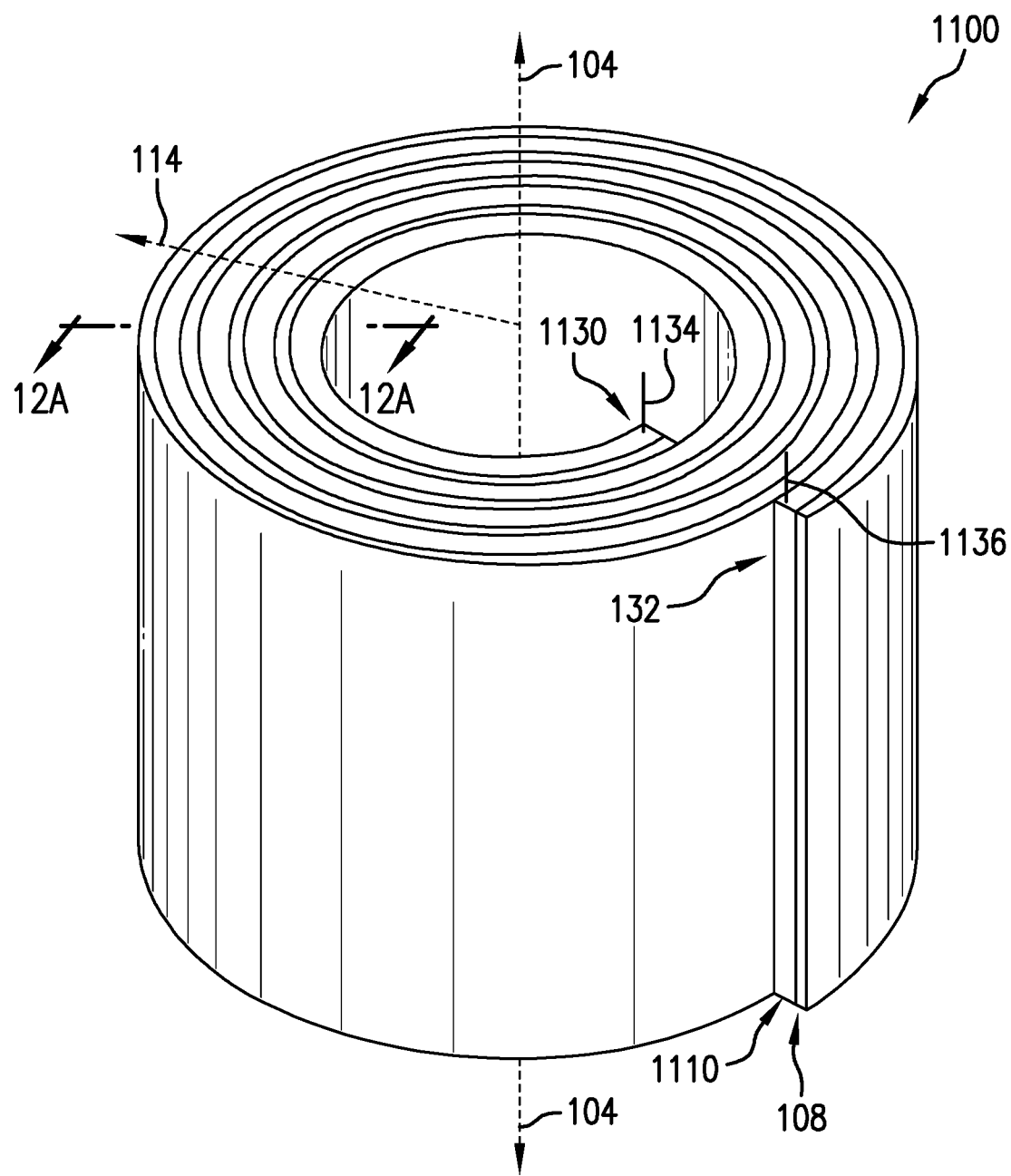
FIG. 11 is a perspective view of an inductive-capacitive filter which is like the FIG. 1 inductive-capacitive filter but has a thicker conductive strip, according to an embodiment.
Figure 12:
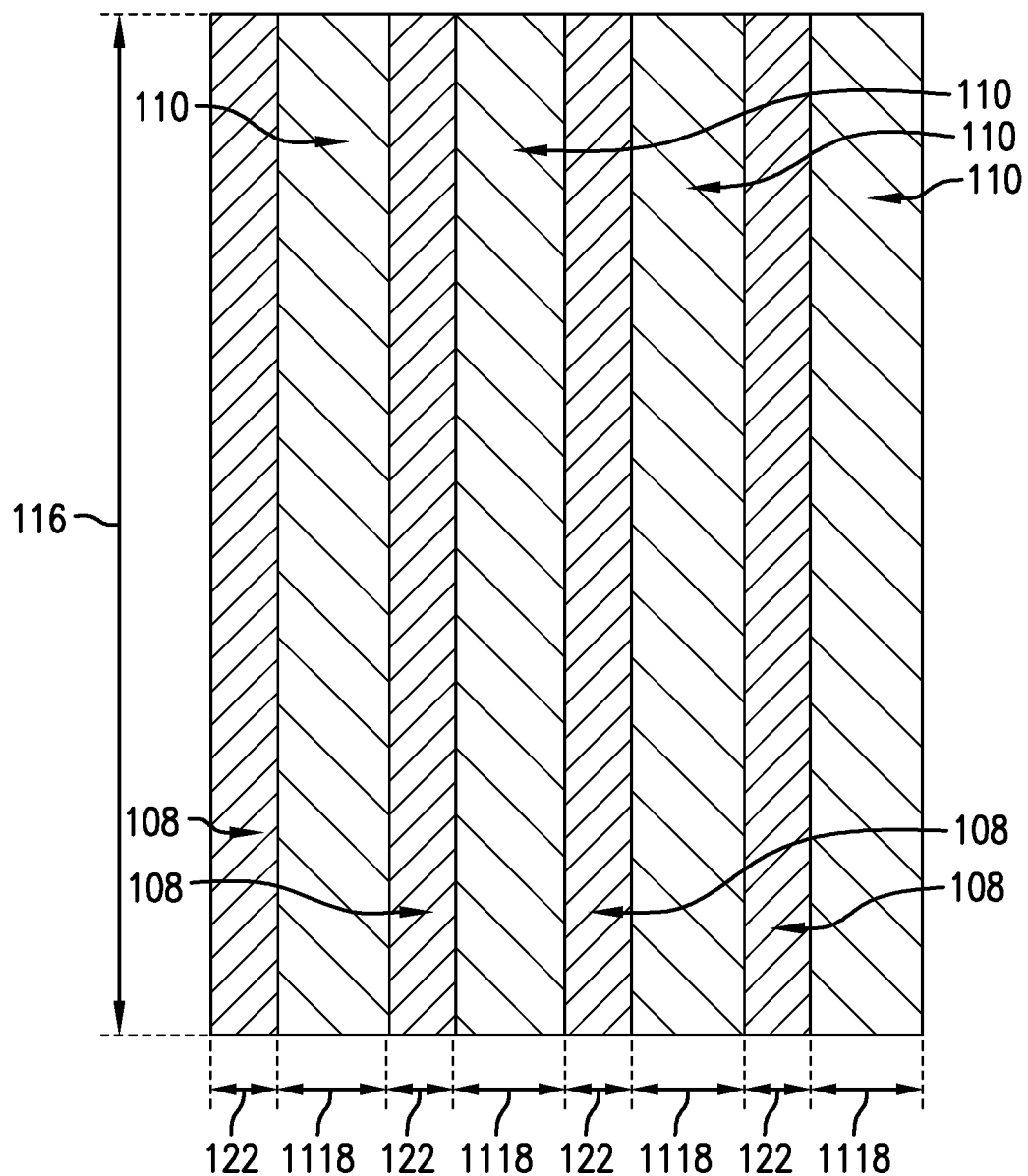
FIG. 12 is a cross-sectional view of the FIG. 11 inductive-capacitive-filter.

The material and/or thickness of conductive strip 110 could be modified in any of the inductive-capacitive filters disclosed herein, such as to tune bandstop characteristics. For example, FIG. 11 is a perspective view of an inductive-capacitive filter 1100 which is like inductive-capacitive filter 100 but with conductive strip 1110 replacing conductive strip 110. FIG. 12 is a cross-sectional view of inductive-capacitive filter 1100 taken along line 12A-12A of FIG. 11. Conductive strip 1110 has a thickness 1118 that is greater than thickness 118 of conductive strip 110. Consequently, inductive-capacitive filter 1100 will have a smaller DC resistance and smaller low frequency AC resistance than inductive-capacitive filter 100.

Conductive strip 1110 has opposing first and second ends 1130 and 1132, respectively. A first terminal 1134 is electrically coupled to first end 1130, and a second terminal 1136 is electrically coupled to second end 1132. First and second terminals 1134 and 1136 provide electrical interface to inductive-capacitive filter 1100. In some embodiments, first and second terminals 1134 and 1136 include a respective aluminum or copper buss bar or wire soldered to conductive strip 1110. First and second terminals 1134 and 1136 could be omitted without departing from the scope hereof.

Figure 13:
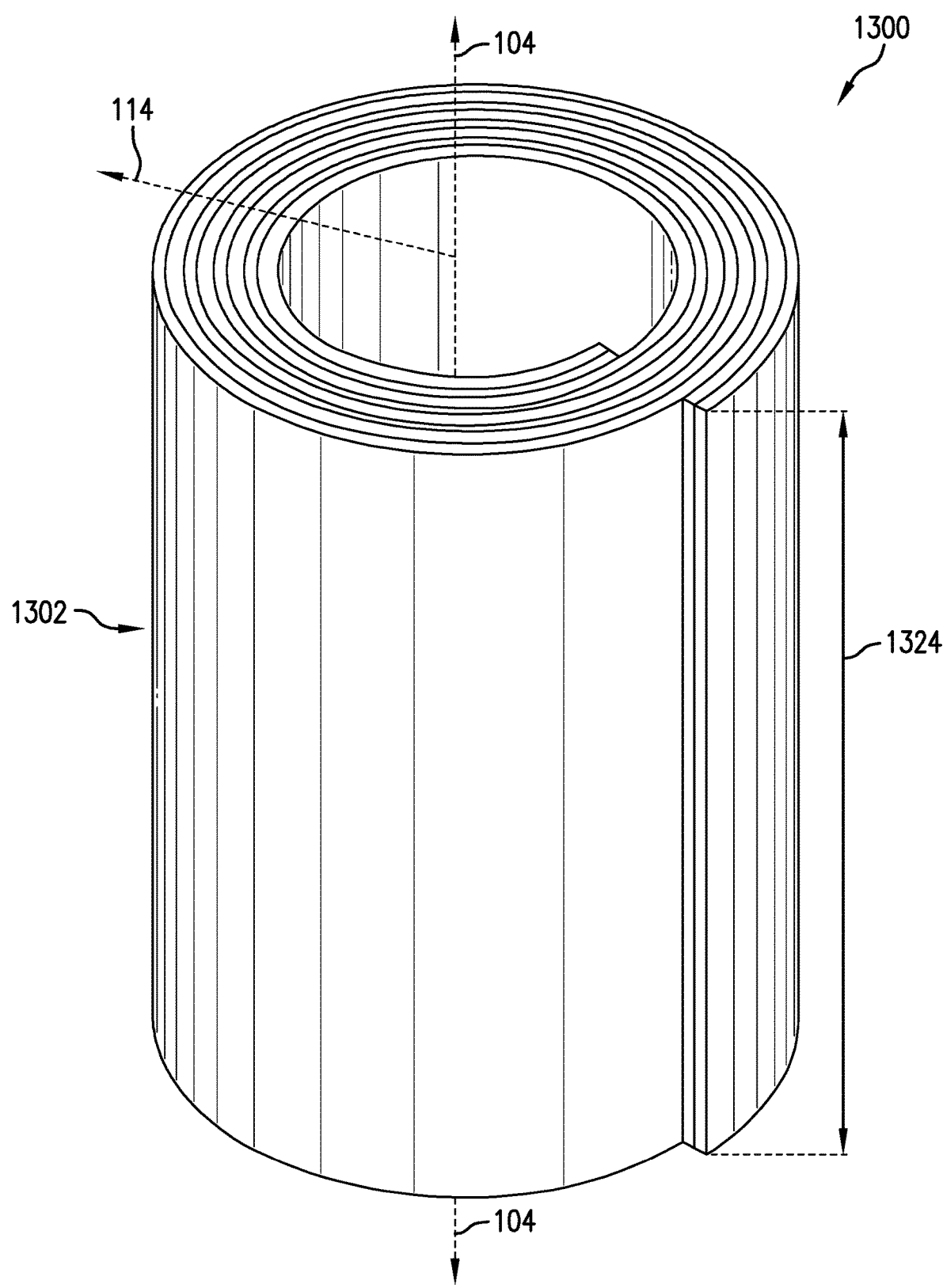
FIG. 13 is a perspective view of an inductive-capacitive filter which is like the FIG. 1 inductive-capacitive filter but with a wider insulating-conductive strip, according to an embodiment.

The width of the insulating-conductive strip of any of the inductive-capacitive filters disclosed herein could also be modified to tune bandstop characteristics. For example, increasing a width 124 (FIG. 1) of insulating-conductive strip 102 increases surface area of adjacent portions of conductive strip 110, thereby increasing capacitance of inductive-capacitive filter 100 and reducing inductance of the filter, resulting in a lower resonant frequency value and a smaller peak impedance. Additionally, increasing insulating-conductive strip width 124 also reduces DC and low frequency AC resistance of inductive-capacitive filter 100, which promotes ability of inductive-capacitive filter 100 to transmit electrical energy with minimal loss. FIG. 13 is a perspective view of an inductive-capacitive filter 1300 which is like inductive-capacitive filter 100 of FIG. 1 but with an insulating-conductive strip 1302 replacing insulating-conductive strip 102. Insulating-conductive strip 1302 is like insulating-conductive strip 102 but has a width 1324 that is greater than width 124 of insulating-conductive strip 102. Consequently, inductive-capacitive filter 1300 has a lower resonant frequency value, lower peak impedance, and lower resistance than inductive-capacitive filter 100.

Figure 14:
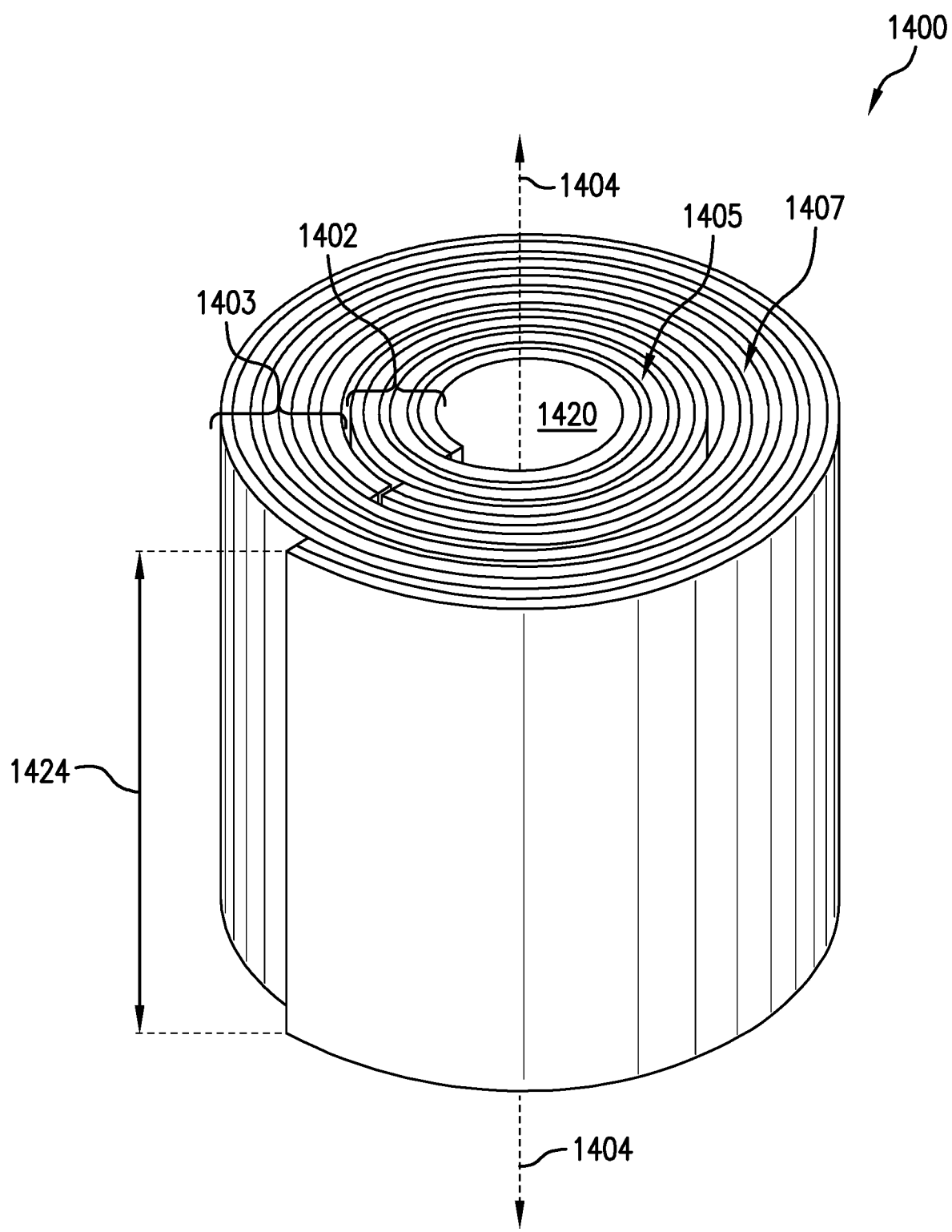
FIG. 14 is a perspective view of an inductive-capacitive filter assembly including two inductive-capacitive filters in a single device, according to an embodiment.

Any two or more of the inductive-capacitive filters disclosed herein could be combined to form an inductive-capacitive filter assembly including two inductive-capacitive filters in a single device, such as to achieve bandstop filtering across two or more frequency bands. For example, FIG. 14 is a perspective view of an inductive-capacitive filter assembly 1400 which includes a first insulating-conductive strip 1402 and second insulating-conductive strip 1403 concentrically wound around a winding axis 1404. First insulating-conductive strip 1402 is disposed within second insulating-conductive strip 1403, as seen when inductive-capacitive filter assembly 1400 is viewed cross-sectionally along a direction of winding axis 1404. First insulating-conductive strip 1402 forms a first inductive-capacitive filter 1405, and second insulating-conductive strip 1403 forms a second inductive-capacitive filter 1407, such that inductive-capacitive assembly 1400 includes two inductive-capacitive filters in a single device. First insulating-conductive strip 1402 includes a first conductive strip joined with a first insulating strip, where the first conductive strip is analogous to conductive strip 110 and the first insulating strip is analogous to insulating strip 108. The first conductive strip and the first insulating strip are not labeled in FIG. 14 to promote illustrative clarity. Similarly, second insulating-conductive strip 1403 includes a second conductive strip (not labeled) and a second insulating strip (not labeled) which are also analogous to conductive strip 110 and insulating strip 108, respectively.

Bandstop characteristics can be varied during the design and/or manufacture of inductive-capacitive filter assembly 1400, for example, by (1) varying number of turns of first insulating-conductive strip 1402 and/or second insulating-conductive strip 1403, (2) varying the size and/or shape of an inner aperture 1420 of inductive-capacitive filter assembly 1400, (3) varying thickness and/or dielectric properties of the insulating strips, (4) varying the thickness of the conductive strips, and/or (5) varying a width 1424 of insulating-conductive strips 1402 and 1403, such as in a manner similar to that discussed above with respect to FIGS. 1-13. Additionally, although insulating-conductive strips 1402 and 1403 are illustrated as forming three and four turns, respectively, the number of turns formed by insulating-conductive strips 1402 and 1403 may be varied without departing from the scope hereof. Furthermore, inductive-capacitive filter assembly 1400 could be modified to include one or more additional insulating-conductive strips, such that all insulating-conductive strips are concentrically wound around winding axis 1404, without departing from the scope hereof.

Figure 15:
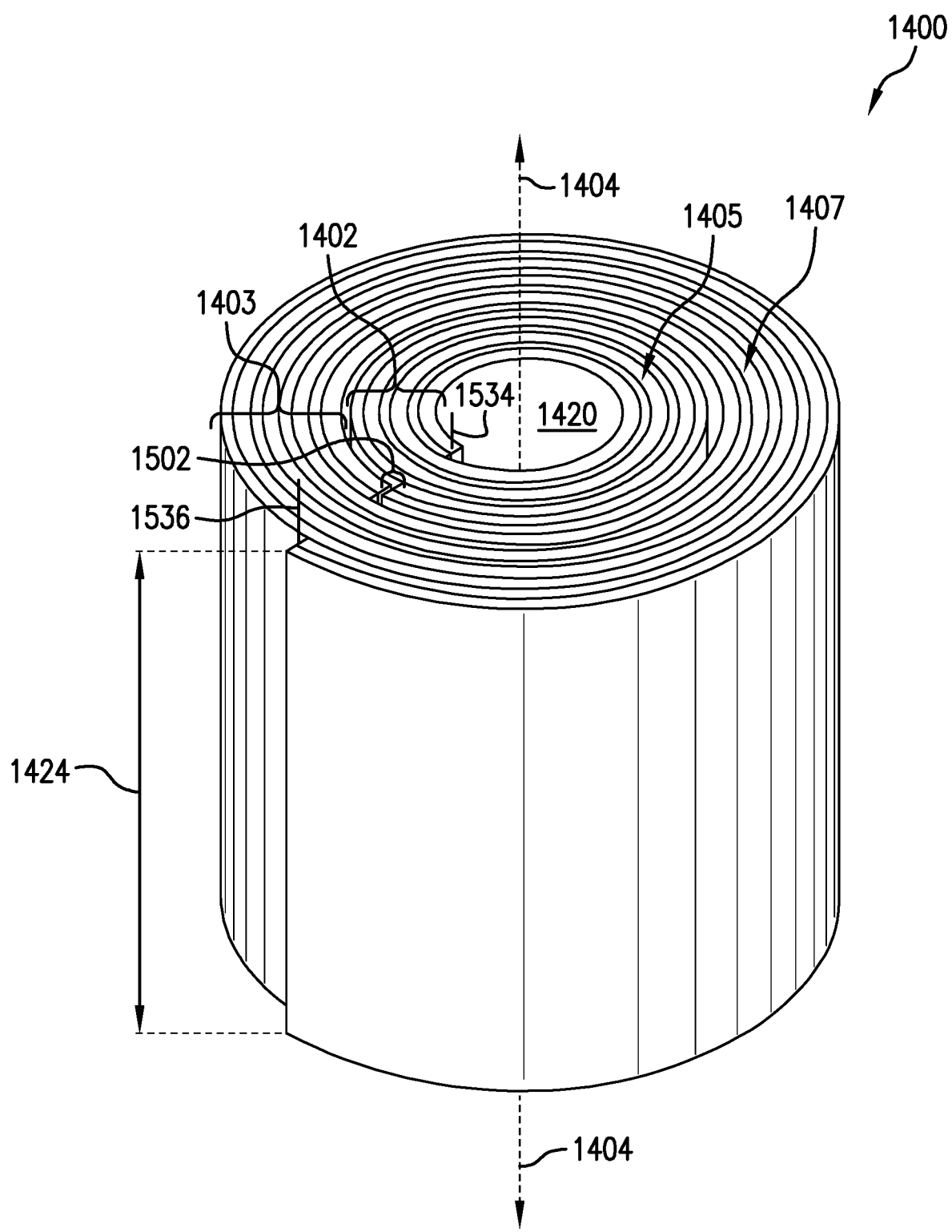
FIG. 15 illustrates the inductive-capacitive filter assembly of FIG. 14 with first and second insulating-conductive strips electrically coupled in series, according to an embodiment.
Figure 16:
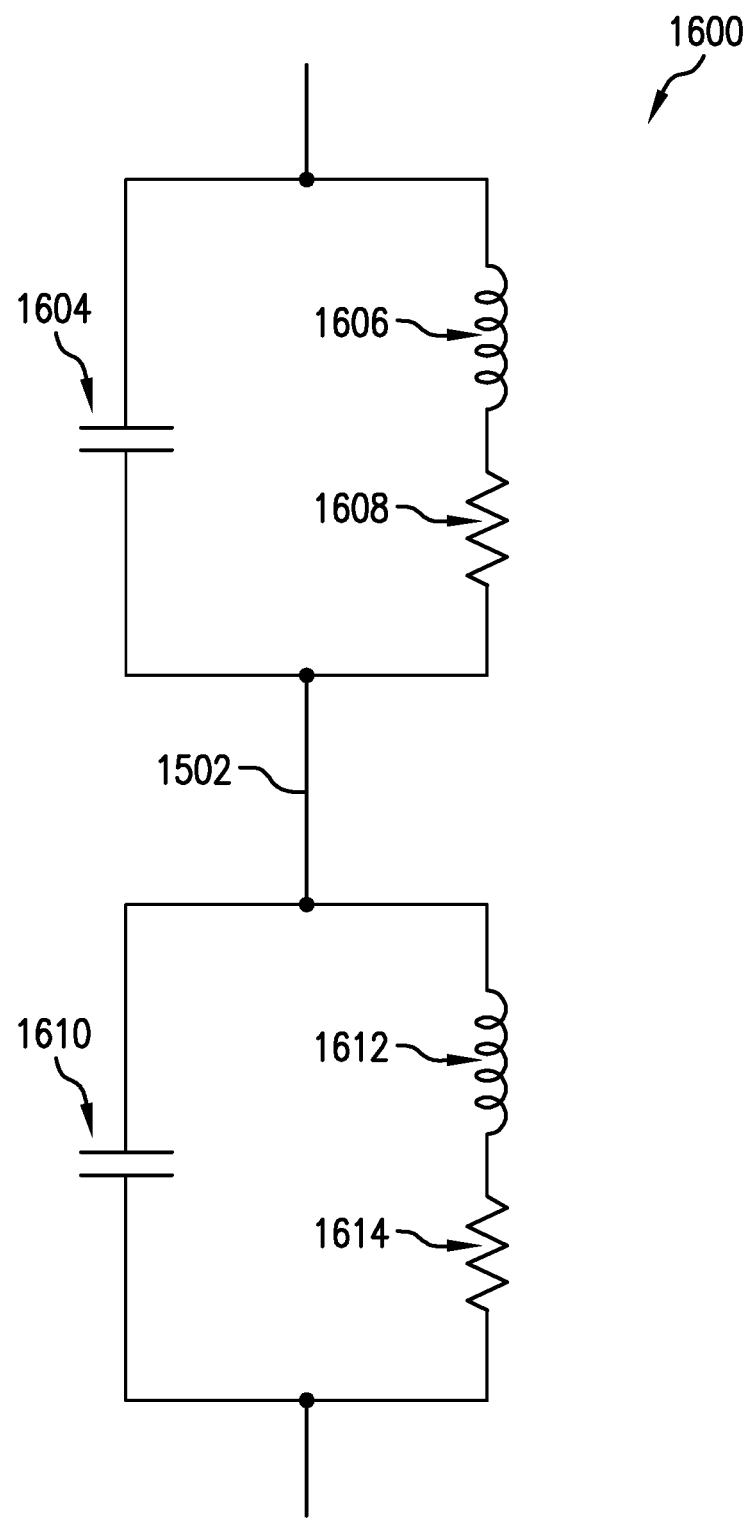
FIG. 16 illustrates an approximate electrical model of the FIG. 14 inductive-capacitive filter assembly when electrically coupled as illustrated in FIG. 15.

The inductive-capacitive filters of inductive-capacitive filter assembly 1400 are optionally electrically coupled in series or parallel. For example, FIG. 15 illustrates inductive-capacitive filter assembly 1400 with first insulating-conductive strip 1402 electrically coupled in series with second insulating-conductive strip 1403 by an electrical conductor 1502. A first terminal 1534 is electrically coupled to a first end of first insulating-conductive strip 1402, and a second terminal 1536 is electrically coupled to a second end of second insulating-conductive strip 1403. First and second terminals 1534 and 1356 provide electrical interface to inductive-capacitive filter assembly 1400. In some embodiments, first and second terminals 1534 and 1536 include a respective aluminum or copper buss bar or wire. First and second terminals 1534 and 1536 could be omitted without departing from the scope hereof. FIG. 16 illustrates an approximate electrical model 1600 of inductive-capacitive filter assembly 1400 electrically coupled as illustrated in FIG. 15, as seen from first and second terminals 1534 and 1536. Capacitor 1604 represents capacitance of first insulating-conductive strip 1402, inductor 1606 represents inductance of first insulating-conductive strip 1402, and resistor 1608 represents resistance of first insulating-conductive strip 1402. Capacitor 1610 represents capacitance of second insulating-conductive strip 1403, inductor 1612 represents inductance of second insulating-conductive strip 1403, and resistor 1614 represents resistance of first insulating-conductive strip 1403.

Figure 17:
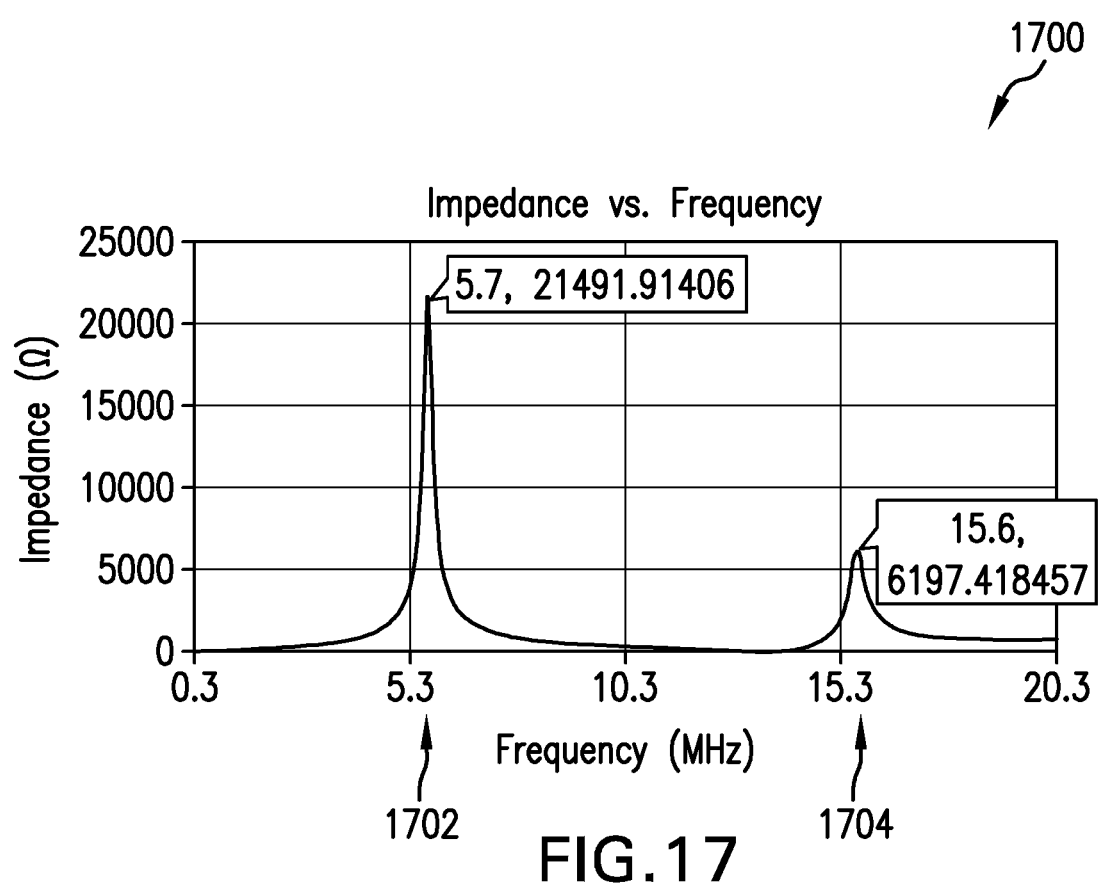
FIG. 17 is a graph of impedance versus frequency of one particular embodiment of the FIG. 14 inductive-capacitive filter assembly when electrically coupled as illustrated in FIG. 15.

FIG. 17 is a graph 1700 of impedance versus frequency of one particular embodiment of inductive-capacitive filter assembly 1400 with first insulating-conductive strip 1402 electrically coupled in series with second insulating-conductive strip 1403 as illustrated in FIG. 15. As evident from FIG. 17, this particular embodiment has a first resonant frequency 1702 of about 5.7 MHz and a second resonant frequency 1704 of about 15.6 MHz. First resonant frequency 1702 is a resonant frequency associated with second inductive-capacitive filter 1407, and second resonant frequency 1704 is a resonant frequency associated with first inductive-capacitive filter 1405. Peak impedance of first inductive-capacitive filter 1405 is about 6,200 ohms at second resonant frequency 1704, and peak impedance of second inductive-capacitive filter 1407 is about 22,000 ohms at first resonant frequency 1702.

Figure 18:
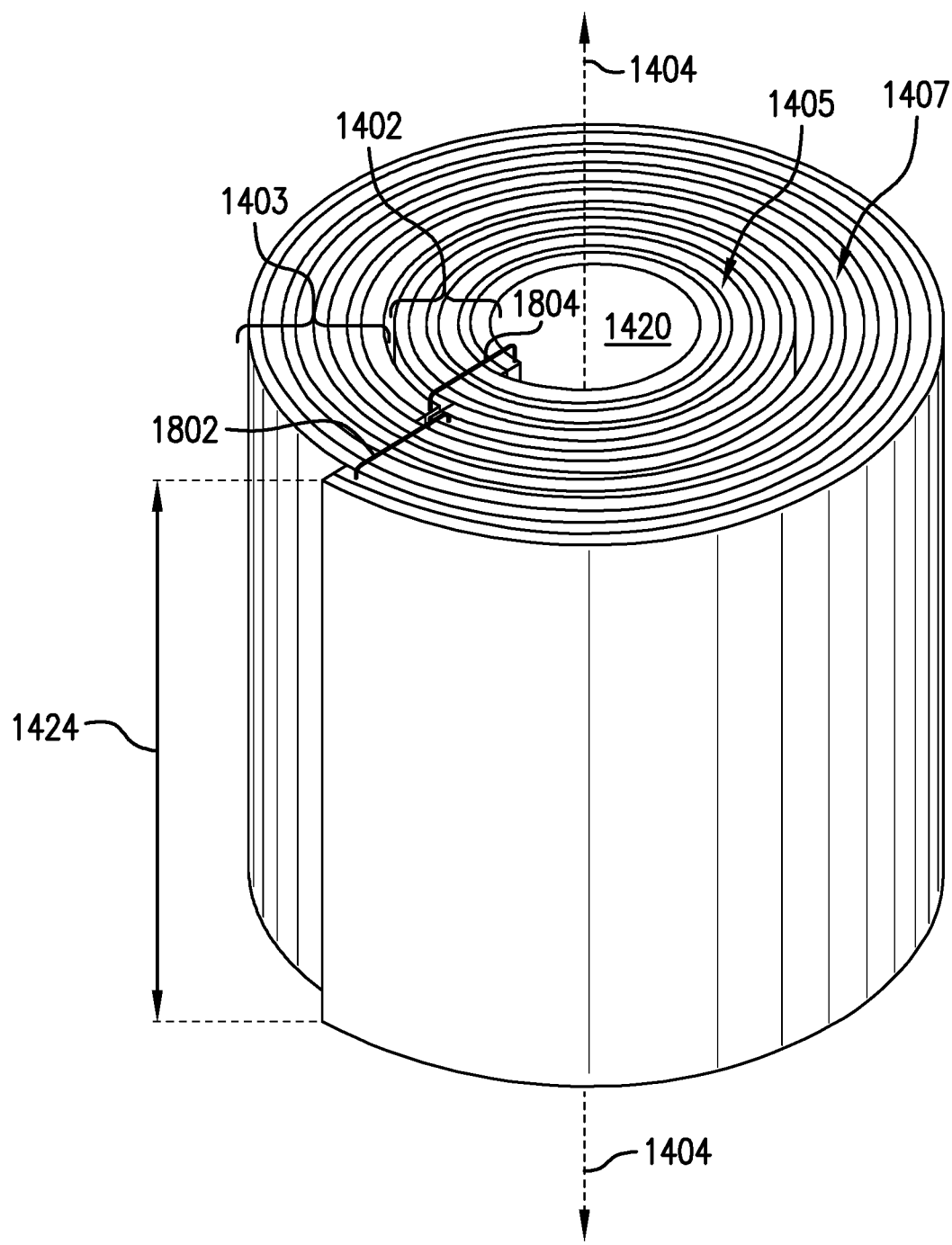
FIG. 18 illustrates the inductive-capacitive filter assembly of FIG. 14 with first and second insulating-conductive strips electrically coupled in parallel, according to an embodiment.
Figure 19:
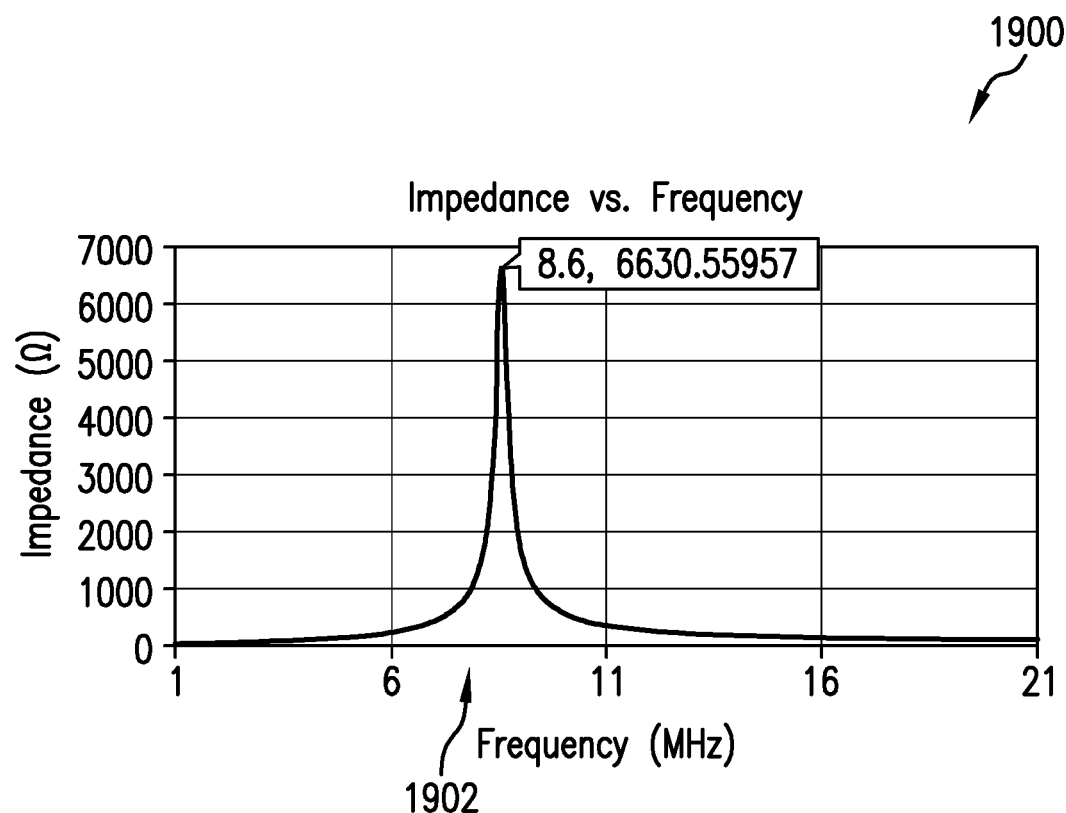
FIG. 19 is a graph of impedance versus frequency of one particular embodiment of the FIG. 14 inductive-capacitive filter assembly when electrically coupled as illustrated in FIG. 18.

FIG. 18 illustrates inductive-capacitive filter assembly 1400 with first insulating-conductive strip 1402 electrically coupled in parallel with second insulating-conductive strip 1403 by an electrical conductors 1802 and 1804, and FIG. 19 is a graph 1900 of impedance versus frequency of one particular embodiment of inductive-capacitive filter assembly 1400 with first insulating-conductive strip 1402 electrically coupled in parallel with second insulating-conductive strip 1403 as illustrated in FIG. 18. As evident from FIG. 19, this particular embodiment has a resonant frequency 1902 of 8.6 MHz and a peak impedance of about 6,600 ohms at resonant frequency 1902.

Figure 20:
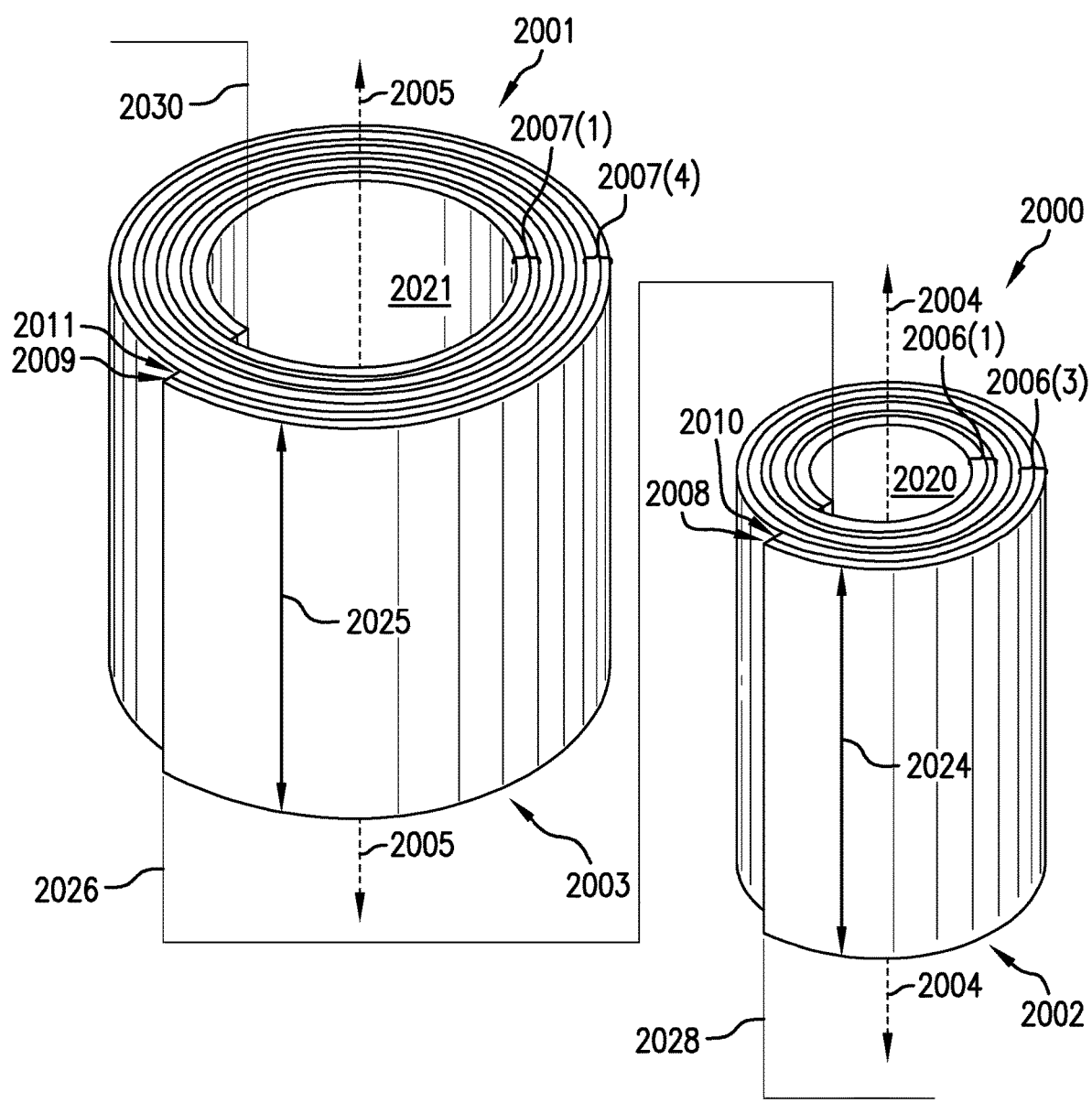
FIG. 20 is a perspective view of two inductive-capacitive filters electrically coupled in series, according to an embodiment.

FIG. 20 is a perspective view of a first inductive-capacitive filter 2000 and a second inductive-capacitive filter 2001 electrically coupled in series by an electrical conductor 2026. Additional electrical conductors 2028 and 2030 provide electrical interface to first and second inductive-capacitive filters 2000 and 2001, respectively. First inductive-capacitive filter 2000 includes a first insulating-conductive strip 2002, and second inductive-capacitive filter 2001 includes a second insulating-conductive strip 2003. First insulating-conductive strip 2002 includes an insulating strip 2008 wound in parallel with a conductive strip 2010 around a winding axis 2004, and second insulating-conductive strip 2003 includes an insulating strip 2009 wound in parallel with a conductive strip 2011 around a winding axis 2005. Each of the first insulating-conductive strip 2002 and second insulating-conductive strip 2003 has, for example, a configuration similar to one or more of the insulating-conductive strips discussed above with respect to FIGS. 1-19. Bandstop characteristics can be varied during the design and/or manufacture of inductive-capacitive filters 2000 and/or 2001, for example, by (1) varying number of turns of first insulating-conductive strip 2002 and/or second insulating-conductive strip 2003, (2) varying the size and/or shape of a inner aperture 2020 and 2021 of inductive-capacitive filters 2000 and 2001, (3) varying thickness and/or dielectric properties of insulating strip 2008 and/or insulating strip 2009, (4) varying thickness of conductive strip 2010 and/or conductive strip 2011, and/or (5) and/or varying a width 2024 and/or width 2025 of first and second insulating-conductive strip 2002 and 2003, respectively, such as in a manner similar to that discussed above with respect to FIGS. 1-19. Additionally, although first and second insulating-conductive strips 2002 and 2003 are illustrated as forming three and four turns 2006 and 2007, respectively, the number of turns of first and second insulating-conductive strips 2002 and 2003 may be varied without departing from the scope hereof. Only some instances of turns 2006 and 2007 are labeled in FIG. 20 to promote illustrative clarity. Furthermore, inductive-capacitive filter 2000 and/or 2001 could be modified to include one or more additional insulating-conductive strips departing from the scope hereof. Moreover, first inductive-capacitive filter 2000 and a second inductive-capacitive filter 2001 could be electrically coupled in parallel without departing from the scope hereof.

Figure 21:
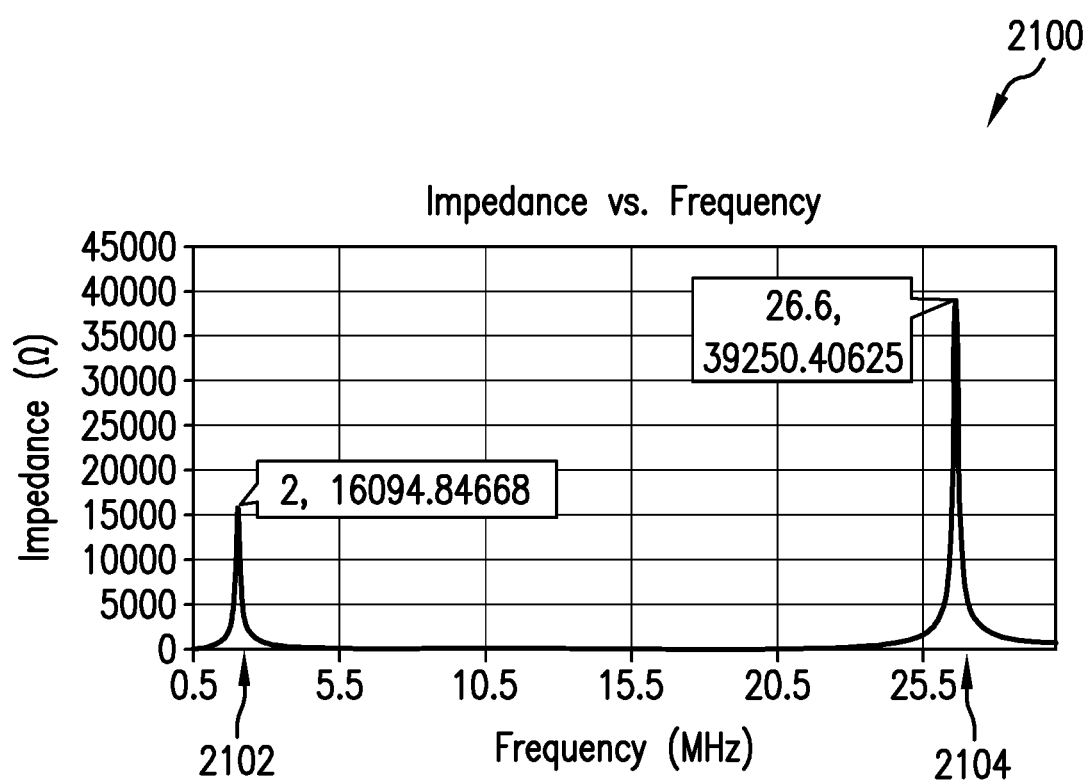
FIG. 21 is a graph of impedance versus frequency of one particular embodiment of the FIG. 20 inductive-capacitive filters electrically coupled in series.

FIG. 21 is a graph 2100 of impedance versus frequency of one particular embodiment of the FIG. 20 inductive-capacitive filters 2000 and 2001 electrically coupled in series. As evident from FIG. 21, this particular embodiment has a first resonant frequency 2102 of about 2 MHz and a second resonant frequency 2104 of about 26.6 MHz. First resonant frequency 2102 is a resonant frequency associated with second inductive-capacitive filter 2001, and second resonant frequency 2104 is a resonant frequency associated with first inductive-capacitive filter 2000. Peak impedance of first inductive-capacitive filter 2000 is about 39,250 ohms at second resonant frequency 2104, and peak impedance of second inductive-capacitive filter 2001 is about 16,095 ohms at first resonant frequency 2102.

Figure 22:
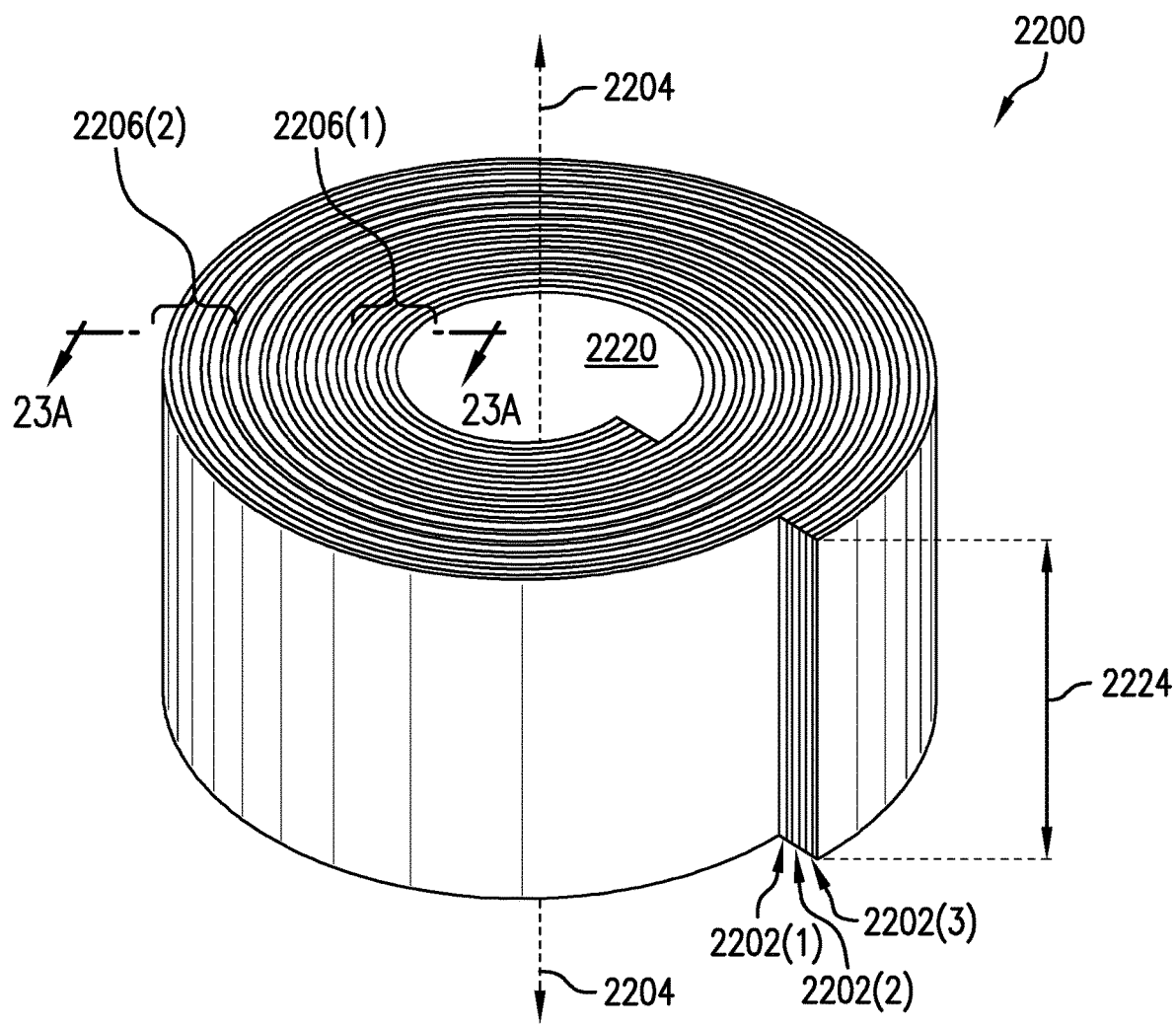
FIG. 22 is a perspective view of an inductive-capacitive filter assembly including additional insulating-conductive strips, according to an embodiment.
Figure 23:
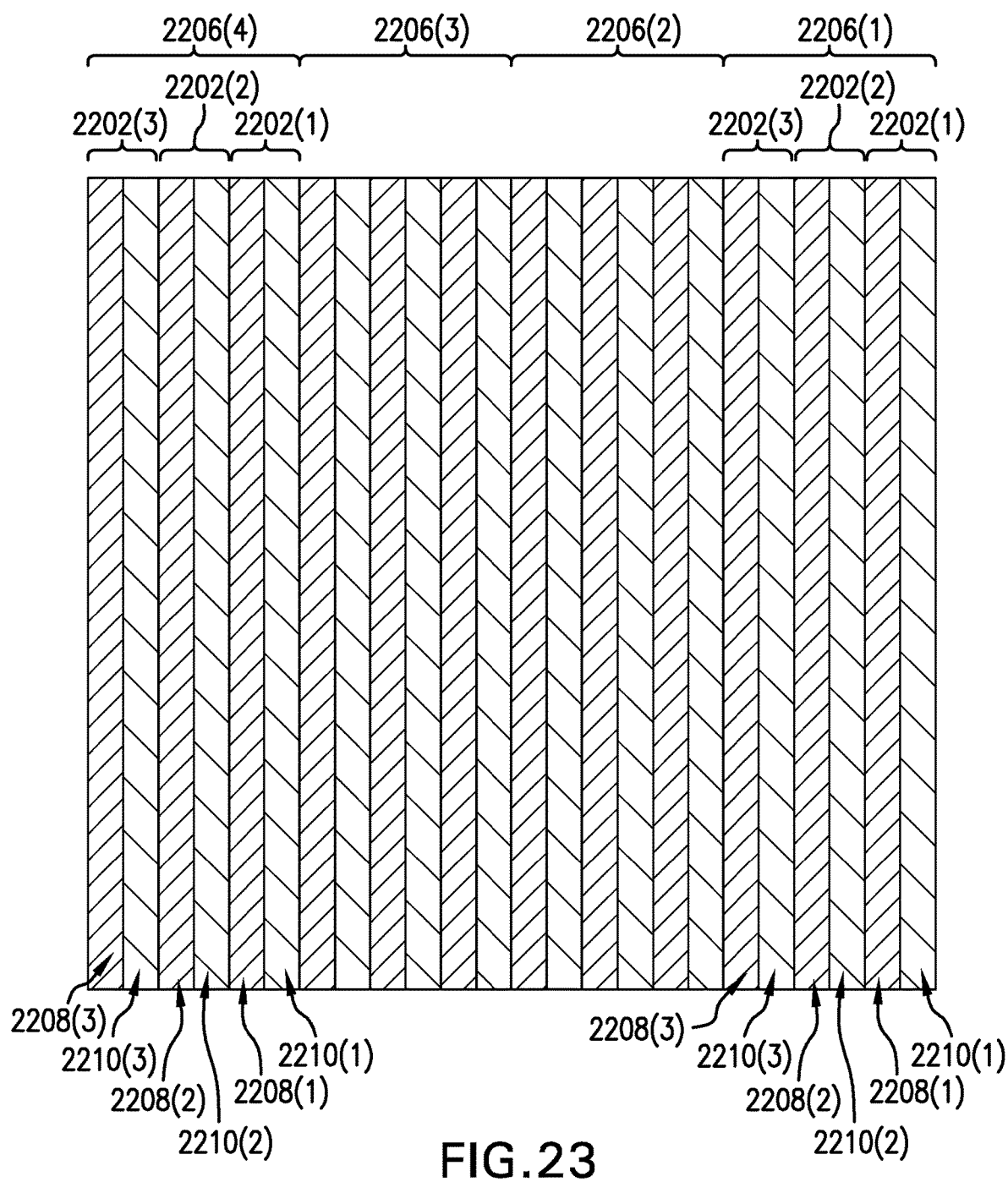
FIG. 23 is a cross-sectional view of the FIG. 22 inductive-capacitive-filter assembly.

Any of the inductive-capacitive filters discussed above could be modified to include one or more additional insulating-conductive strips. For example, FIG. 22 is a perspective view of an inductive-capacitive filter assembly 2200 including three insulating-conductive strips 2202, and FIG. 23 is a cross-sectional view of inductive-capacitive filter assembly 2200 taken along line 23A-23A of FIG. 22. Each insulating-conductive strip 2202 is similar to insulating-conductive strip 102. In particular, first insulating-conductive strip 2202(1) includes a first conductive strip 2210(1) joined with a first insulating strip 2208(1), second insulating-conductive strip 2202(2) includes a second conductive strip 2210(2) joined with a second insulating strip 2208(2), and third insulating-conductive strip 2202(3) includes a third conductive strip 2210(3) joined with a third insulating strip 2208(3). In some embodiments, each conductive strip 2210 includes opposing first and second terminals (not shown) electrically coupled to opposing ends of the conductive strip. Only some instances of insulating-conductive strips 2202, insulating strips 2208 and conductive strips 2210 are labeled in FIG. 23 to promote illustrative clarity. The number of insulating-conductive strips 2202 could be varied without departing from the scope hereof.

Each conductive strip 2210 is used, for example, as a separate channel of a multi-channel bandstop filter, where each channel has similar bandstop characteristics. Bandstop characteristics can be varied during the design and/or manufacture of inductive-capacitive filter assembly 2200, for example, by (1) varying number of turns 2206 of insulating-conductive strips 2202, (2) varying the size and/or shape of a inner aperture 2220 of inductive-capacitive filter assembly 2200, (3) varying thickness and/or dielectric properties of insulating strips 2208, (4) varying thickness of conductive strips 2210, (5) and/or varying a width 2224 of insulating-conductive strips 2202, such as in a manner similar to that discussed above with respect to FIGS. 1-21. Only two instances of turns 2206 are labeled in FIG. 22 to promote illustrative clarity.

Figure 24:
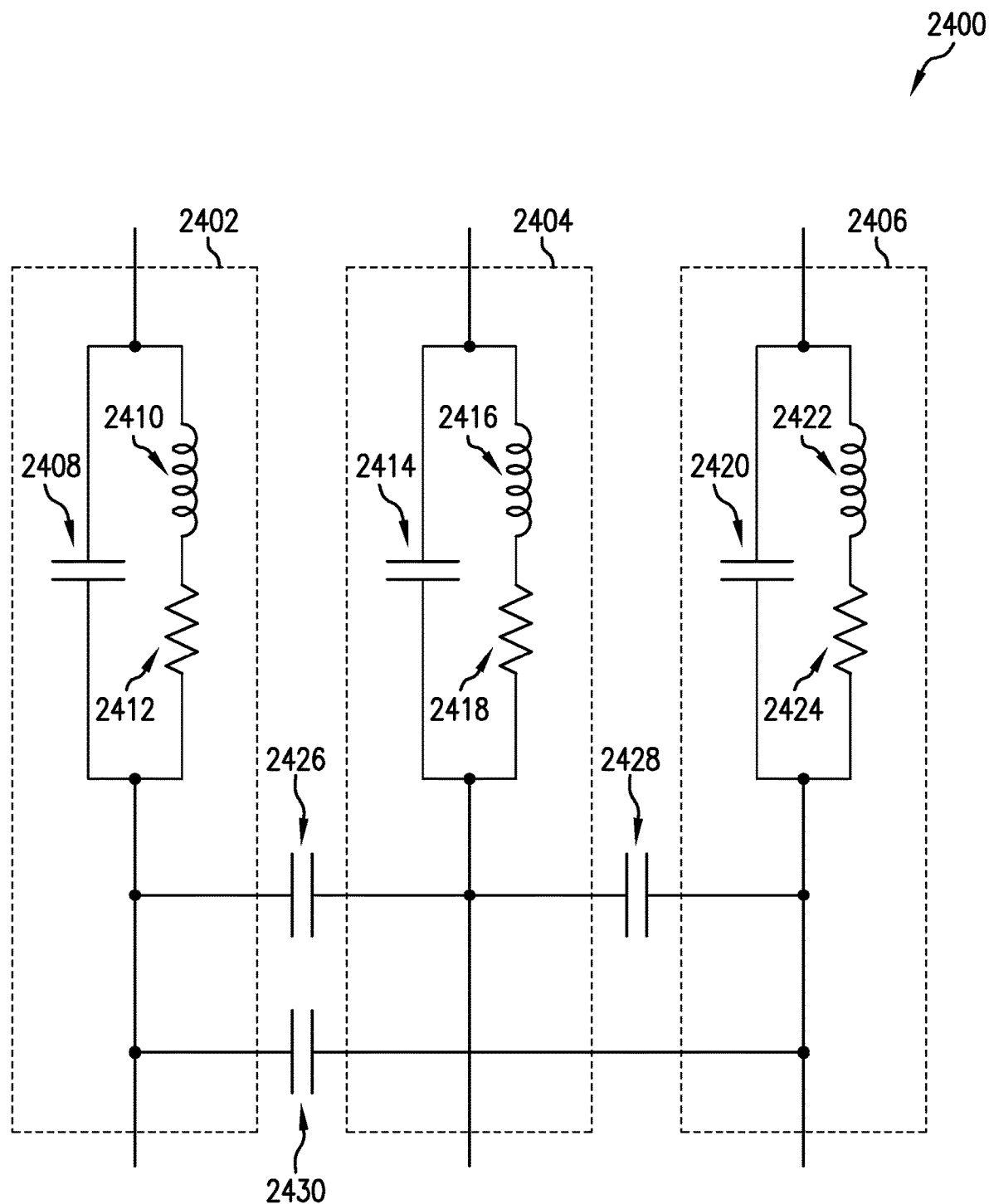
FIG. 24 illustrates an approximate electrical model of the FIG. 22 inductive-capacitive-filter assembly.

Inductive-capacitive filter assembly 2200 has an approximate electric model similar to that of FIG. 3 in applications where conductive strips 2210 are electrically coupled in parallel. In contrast, FIG. 24 illustrates an approximate electrical model 2400 of inductive-capacitive filter assembly 2000 when conductive strips 2210 are not electrically coupled in parallel. In this application, inductive-capacitive filter assembly 2200 forms three channels 2402, 2404, and 2406 corresponding to insulating-conductive strips 2202(1), 2202(2), and 2202(3), respectively, such that each insulating-conductive strip 2202 forms a respective inductive-capacitive filter. Capacitor 2408, inductor 2410, and resistor 2412 represent capacitance, inductance, and resistance, respectively, of channel 2402. Capacitor 2414, inductor 2416, and resistor 2418 represent capacitance, inductance, and resistance, respectively, of channel 2404. Capacitor 2420, inductor 2422, and resistor 2424 represent capacitance, inductance, and resistance, respectively, of channel 2406. Capacitor 2426 represents capacitive coupling between channel 2402 and channel 2404, capacitor 2428 represents capacitive coupling between channel 2404 and channel 2406, and capacitor 2430 represents capacitive coupling between channel 2402 and channel 2406. Although electrical model 2400 of FIG. 24 illustrates each component being a discrete element for illustrative simplicity, each of these components represents a distributed element. Additionally, model 2400 does not account for high-order effects, such as a leakage current through capacitors, capacitance of inductors, or inductance of capacitors.

Figure 25:
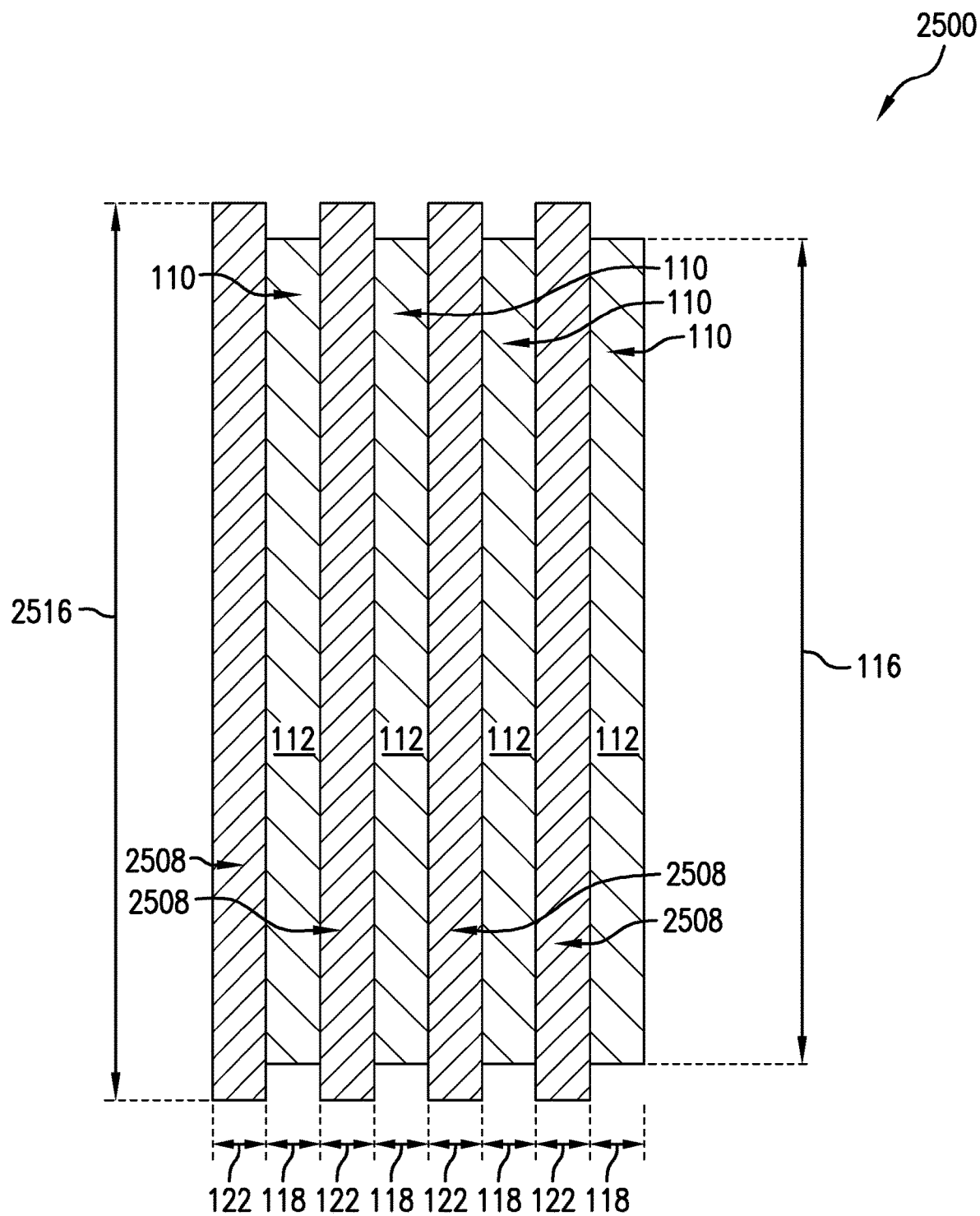
FIG. 25 is a cross-sectional view of an inductive-capacitive filter which is like the FIG. 1 inductive-capacitive filter but where a width of an insulating strip is greater than a width of a conductive strip, according to an embodiment.

Although the insulating strip and the conductive strip have a common width in the illustrations of FIGS. 1, 2, 5-15, 18, 20, 22, and 23, insulating strip width and conductive strip width need not be the same. For example, FIG. 25 is a cross-sectional view analogous to FIG. 2 of an inductive-capacitive filter 2500 which is like the FIG. 1 inductive-capacitive filter but including an insulating strip 2508 in place of insulating strip 108. Insulating strip 2508 has a width 2516 that is greater than a width 116 of conductive strip 110, such as to reduce the likelihood of accidental shorting of adjacent sections of conductive strip 110.

Inductive-capacitive filters 100, 500, 600, 700, 800, 900, 1100, 1300, 1405, 1407, 2000, 2001, 2200, and 2500 do not have an explicit magnetic core, or in other words, these inductive-capacitive filters have an "air" core. However, any of the inductive-capacitive filters disclosed herein could be modified to include an explicit magnetic core formed of a magnetic material, including but not limited to a ferrite magnetic material or an iron powder magnetic material. The magnetic core, which may form either a partial magnetic flux path or a complete magnetic flux path, affects the resonant frequency of the inductive-capacitive filter. In particular, inductance increases with decreased reluctance of the magnetic flux path of the inductive-capacitive filter, and increasing inductance decreases the filter's resonant frequency. Consequently, resonant frequency of an inductive-capacitive filter with a given magnetic core can be tuned by varying magnetic permeability of magnetic material forming the magnetic core, such that resonant frequency decreases with increasing magnetic permeability of the magnetic material.

Figure 26:
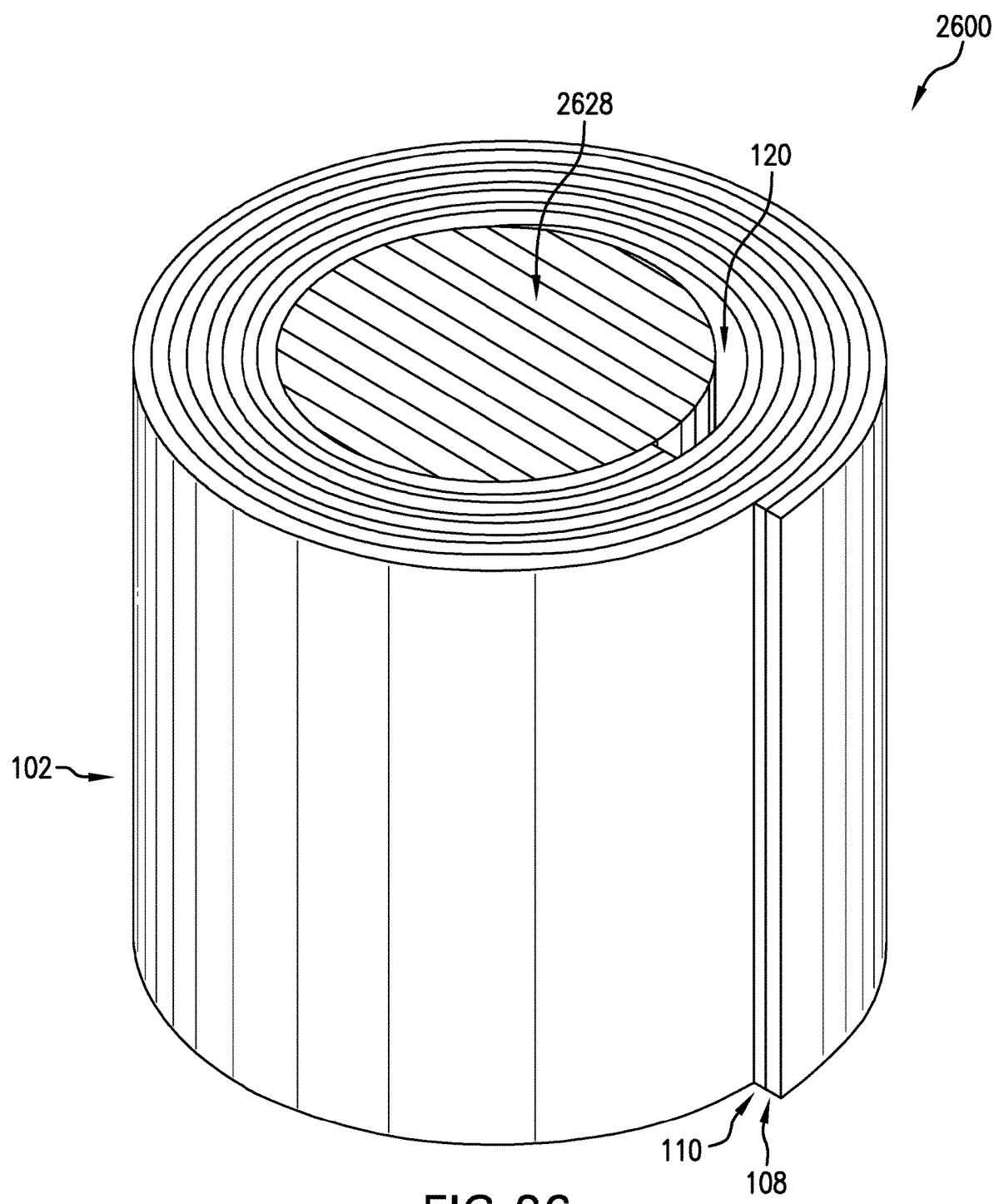
FIG. 26 illustrates a perspective view of an inductive-capacitive filter including a rod type magnetic core disposed in an inner aperture, according to an embodiment.

FIG. 26 illustrates a perspective view of an inductive-capacitive filter 2600 which is like inductive-capacitive filter 100 of FIG. 1 but further including a rod type magnetic core 2628 disposed in inner aperture 120. Rod type magnetic core 2628 forms only a partial magnetic flux path, or in other words, rod type magnetic core 2628 does not form a closed path around resonant strip 102. Nevertheless, rod type magnetic core 2628 significantly lowers reluctance of magnetic flux paths of inductive-capacitive filter 2600 such that inductive-capacitive filter 2600 has a lower resonant frequency than inductive-capacitive filter 100 of FIG. 1. First and second terminals 134 and 136 are not shown in FIG. 26 to promote illustrative clarity.

Figure 27:
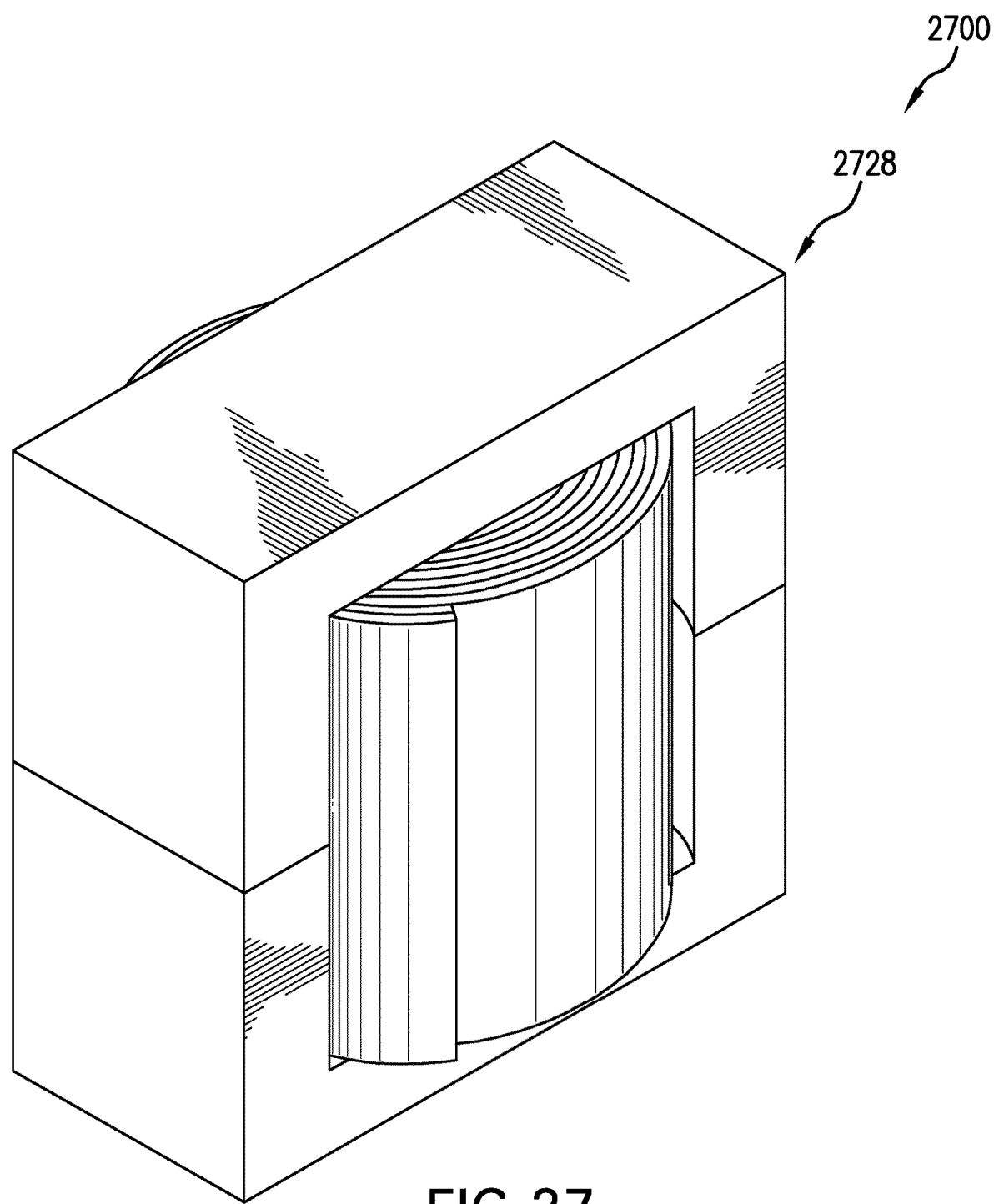
FIG. 27 illustrates a perspective view of another inductive-capacitive filter including an E type magnetic core disposed in an inner aperture, according to an embodiment.
Figure 28:
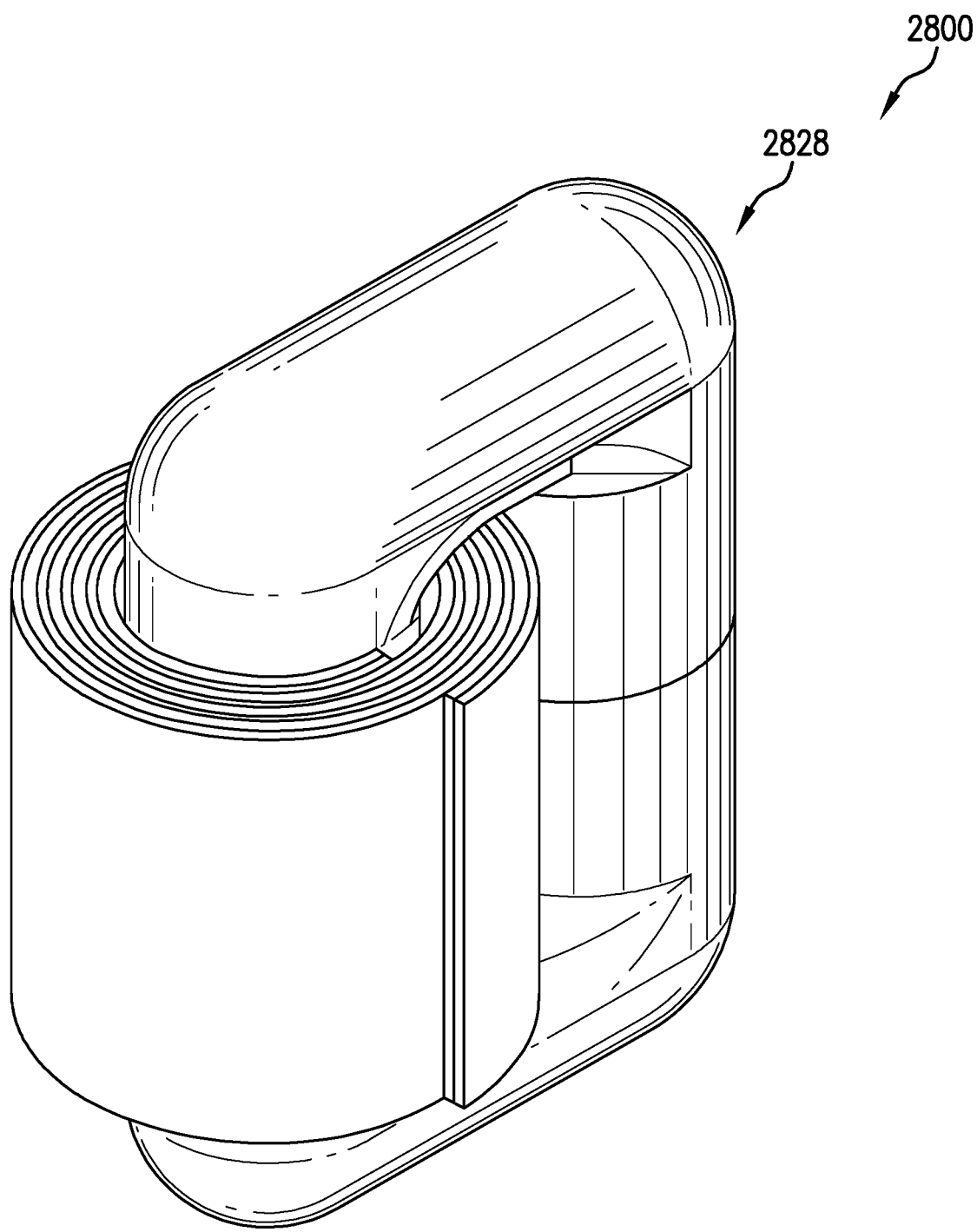
FIG. 28 illustrates a perspective view of another inductive-capacitive filter including an U type magnetic core disposed in an inner aperture, according to an embodiment.
Figure 29:
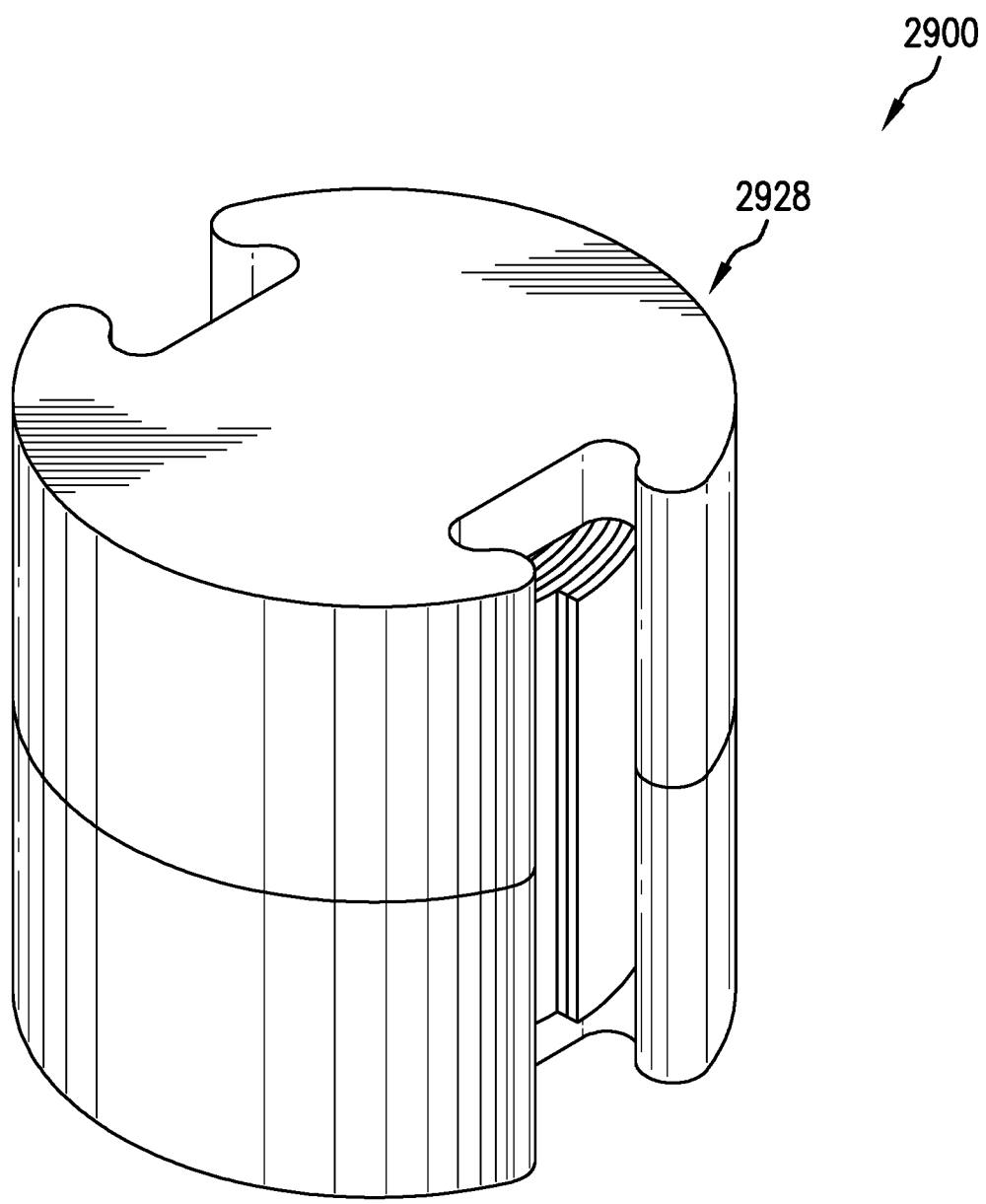
FIG. 29 illustrates a perspective view of yet another inductive-capacitive filter including a pot type magnetic core disposed in an inner aperture, according to an embodiment.

FIGS. 27-29 each illustrate a respective example of an inductive-capacitive filter with a magnetic core forming a complete magnetic path, or in other words, with a magnetic core forming a closed path around an insulating-conductive strip of the inductive-capacitive filter. In particular, FIG. 27 illustrates a perspective view of an inductive-capacitive filter 2700 which is like inductive-capacitive filter 100 of FIG. 1 but further including a magnetic core 2728. Magnetic core 2728 included an inner post (not visible in FIG. 27) extending through inner aperture 120 and an outer portion connecting opposing ends of the inner post. In some embodiments, magnetic core 2728 is formed of two "E" cores, and in some other embodiments, magnetic core 2728 is formed of an "I" core and an "E" core. Magnetic core 2728 provides a lower-reluctance magnetic flux path than magnetic core 2628 of FIG. 26, and therefore, inductive-capacitive filter 2700 of FIG. 27 will have a lower resonant frequency than inductive-capacitive filter 2600 of FIG. 26. First and second terminals 134 and 136 are not shown in FIG. 27 to promote illustrative clarity.

FIG. 28 illustrates a perspective view of an inductive-capacitive filter 2800 which is like inductive-capacitive filter 100 of FIG. 1 but further including a magnetic core 2828. In some embodiments, magnetic core 2828 is formed of two "U" cores, and in some other embodiments, magnetic core 2828 is formed of an "I" core and an "U" core. Magnetic core 2828 provides a lower-reluctance magnetic flux path than magnetic core 2628 of FIG. 26, and therefore, inductive-capacitive filter 2800 of FIG. 28 will have a lower resonant frequency than inductive-capacitive filter 2600 of FIG. 26. First and second terminals 134 and 136 are not shown in FIG. 28 to promote illustrative clarity.

FIG. 29 illustrates a perspective view of an inductive-capacitive filter 2900 which is like inductive-capacitive filter 100 of FIG. 1 but further including a magnetic core 2928. Magnetic core 2928 is similar to magnetic core 2728 of FIG. 27 but has a rounded outer portion connecting opposing ends of an inner post (not visible in FIG. 29) extending through inner aperture 120. In some embodiments, magnetic core 2928 is formed of two pot cores. Magnetic core 2928 provides a lower-reluctance magnetic flux path than either magnetic core 2628 of FIG. 26, magnetic core 2728 of FIG. 27, or magnetic core 2828 of FIG. 28, and therefore, inductive-capacitive filter 2900 of FIG. 29 will have a lower resonant frequency than either of inductive-capacitive filter 2600 of FIG. 26, inductive-capacitive filter 2700 of FIG. 27, or inductive-capacitive filter 2800 of FIG. 28. First and second terminals 134 and 136 are not shown in FIG. 29 to promote illustrative clarity.

Figure 30:
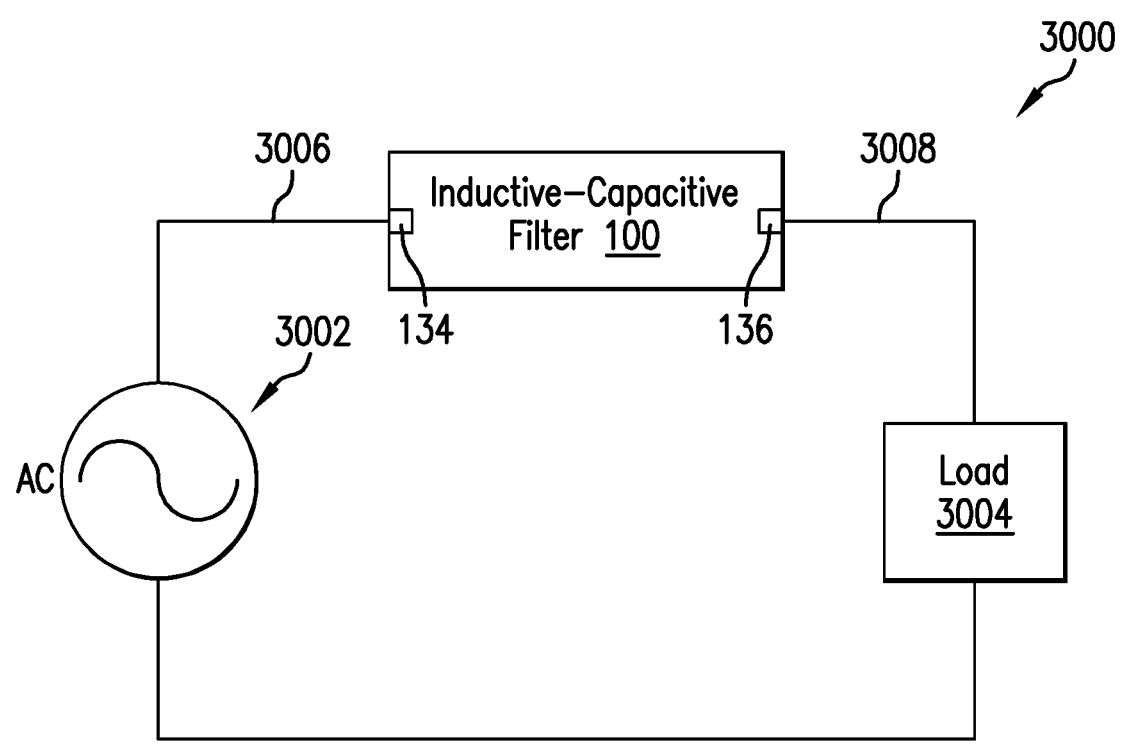
FIG. 30 illustrates an electrical circuit including an instance of the FIG. 1 inductive-capacitive filter, according to an embodiment.

One possible application of the inductive-capacitive filters disclosed herein is in an electrical circuit, such as to implement a bandstop filter which blocks signals having frequencies within a certain frequency band around the filter's resonant frequency while transmitting signals away from the resonant frequency. For example, FIG. 30 illustrates an electrical circuit 3000 including an instance of inductive-capacitive filter 100 electrically coupled in series with an alternating current (AC) electrical power source 3002 and a load 3004. Circuit 3000 is, for example, part of a semiconductor processing system. In certain embodiments, electrical power source 3002 represents an AC electric grid (e.g., operating at 50 or 60 Hertz), an AC generator, an inverter, an oscillator, an audio amplifier, or a radio-frequency amplifier, and load 3004 represents a linear load (e.g., resistive, inductive, and/or capacitive load) or a non-linear load (e.g., a switching power supply load). First end 130 of conductive strip 110 of inductive-capacitive filter 100 is electrically coupled to electrical power source 3002 via first terminal 134 at a first node 3006, and second end 132 of conductive strip 110 is electrically coupled to load 3004 via terminal 136 at a second node 3008, in electrical circuit 3000. Thus first and second ends 130 and 132 of conductive strip 110 are electrically coupled to different respective nodes 3006 and 3008 of electrical circuit 3000. In this particular application, inductive-capacitive filter 100 blocks transmission of signals within a particular frequency band near filter 100's resonant frequency, such as to prevent transmission of undesired signals generated by electric power source 3002 or by load 3004. Inductive-capacitive filter 100 is tuned, for example, to have a resonant frequency near or equal to the frequency of the undesired signals, such that inductive-capacitive filter 100 has a high-impedance at this frequency and thereby substantially blocks transmission of the undesired signals in electrical circuit 3000.

Figure 31:
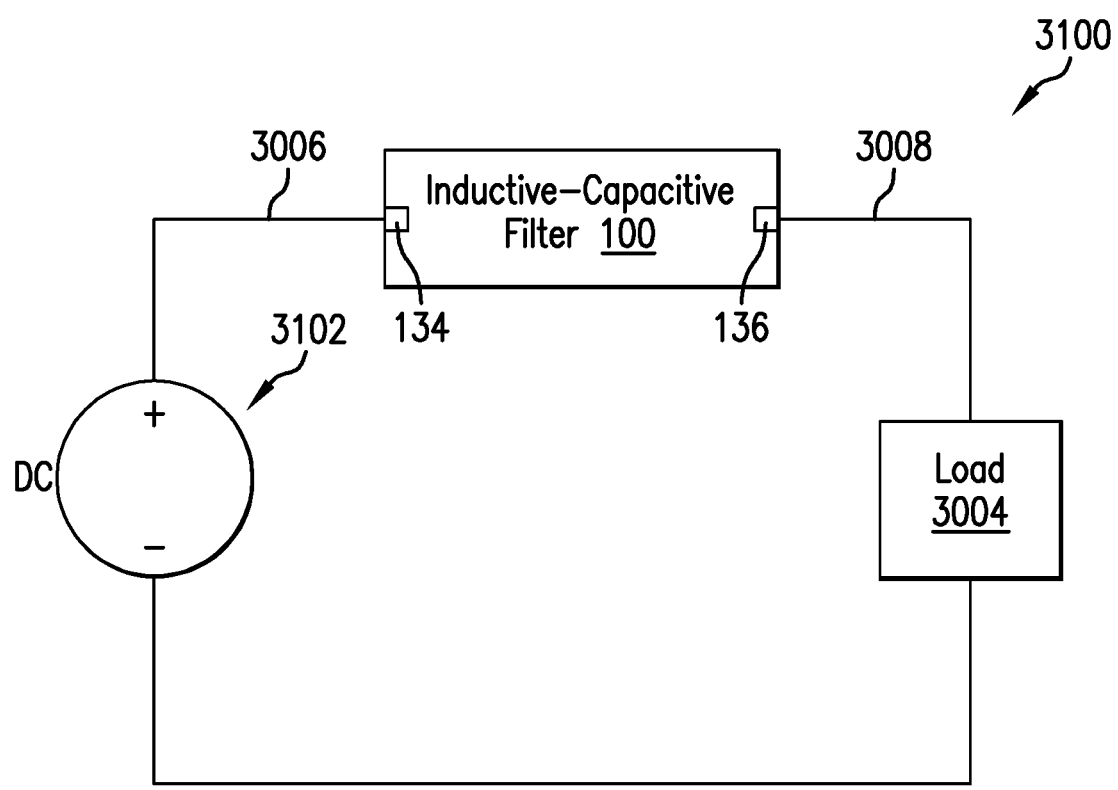
FIG. 31 illustrates another electrical circuit including an instance of the FIG. 1 inductive-capacitive filter, according to an embodiment.

AC electrical power source 3002 could be replaced with a direct current (DC) electrical power source without departing from the scope hereof. For example, FIG. 31 illustrates an electrical circuit 3100 which is like electrical circuit 3000 of FIG. 30 but with AC electrical power source 3002 replace with a direct current (DC) electric power source 3102. DC electric power source 3102 is, for example, a DC electric power buss, a power supply, a battery, or one or more photovoltaic cells.

In a particular embodiment, load 3004 is a power supply which generates an AC output signal at a frequency $f_1$ for powering external circuitry (not shown). This power supply is sensitive to noise from AC electric power source 3002 or DC electric power source 2802 having a frequency $f_1$, and inductive-capacitive filter 100 is accordingly tuned to block transmission of signals having a frequency $f_1$.

Electrical circuits 3000 and 3100 could be modified to replace inductive-capacitive filter 100 with any of the other inductive-capacitive filters disclosed herein without departing from the scope hereof. Additionally, the topology of electrical circuits 3000 and 2100 could be modified without departing from the scope hereof. For example, electrical circuit 3000 could be modified such that inductive-capacitive filter 100 is electrically coupled in parallel with each of electrical power source 3002 and load 3104, to shunt all signals except those having a frequency near the resonant frequency of inductive-capacitive filter 100.

Figure 32:
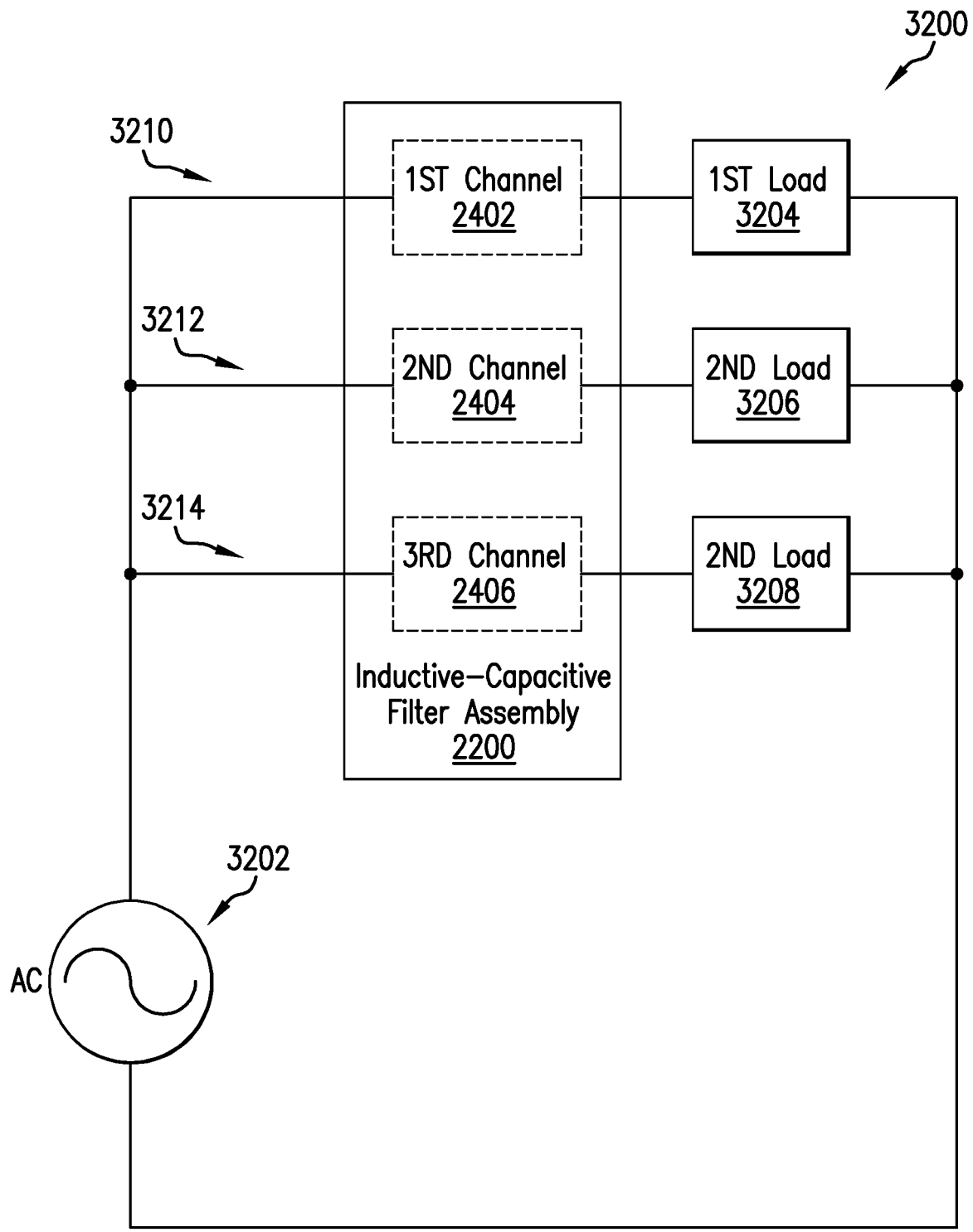
FIG. 32 illustrates an electrical circuit including an instance of the FIG. 22 inductive-capacitive filter assembly, according to an embodiment.

FIG. 32 illustrates an electrical circuit 3200 including an instance of inductive-capacitive filter assembly 2200, an AC electrical power source 3202, a first load 3204, a second load 3206, and a third load 3208. First channel 2402 of inductive-capacitive filter assembly 2200 is electrically coupled between AC electrical power source 3202 and first load 3204 in a first branch 3210 of electrical circuit 3200, second channel 2404 of inductive-capacitive filter assembly 2200 is electrically coupled between AC electrical power source 3202 and second load 3206 in a second branch 3212 of electrical circuit 3200, and third channel 2406 of inductive-capacitive filter assembly 2200 is electrically coupled between AC electrical power source 3202 and third load 3208 in a third branch 3208 of electrical circuit 3200. Circuit 3200 is, for example, part of a semiconductor processing system. AC electrical power source 3202 may be replaced with a DC electrical power source without departing from the scope hereof.

In a particular embodiment, first load 3204 is a first power supply which generates an AC output signal at a first frequency $f_1$ for powering external circuitry (not shown), second load 3206 is a second power supply which generates an AC output signal at a second frequency $f_2$ for powering external circuitry (not shown), and third load 3208 is a third power supply which generates an AC output signal at a third frequency $f_3$ for powering external circuitry (not shown). The first, second, and third power supplies are sensitive to noise from AC electrical power source 3202 having a frequency $f_1$, a frequency $f_2$, and a frequency $f_3$, respectively. Accordingly, first channel 2402 of inductive-capacitive filter 2200 is tuned to block transmission of signals having a frequency $f_1$, second channel 2404 of inductive-capacitive filter 2200 is tuned to block transmission of signals having a frequency $f_2$, and third channel 2406 of inductive-capacitive filter 2200 is tuned to block transmission of signals having a frequency $f_3$, in this application.

Figure 33:
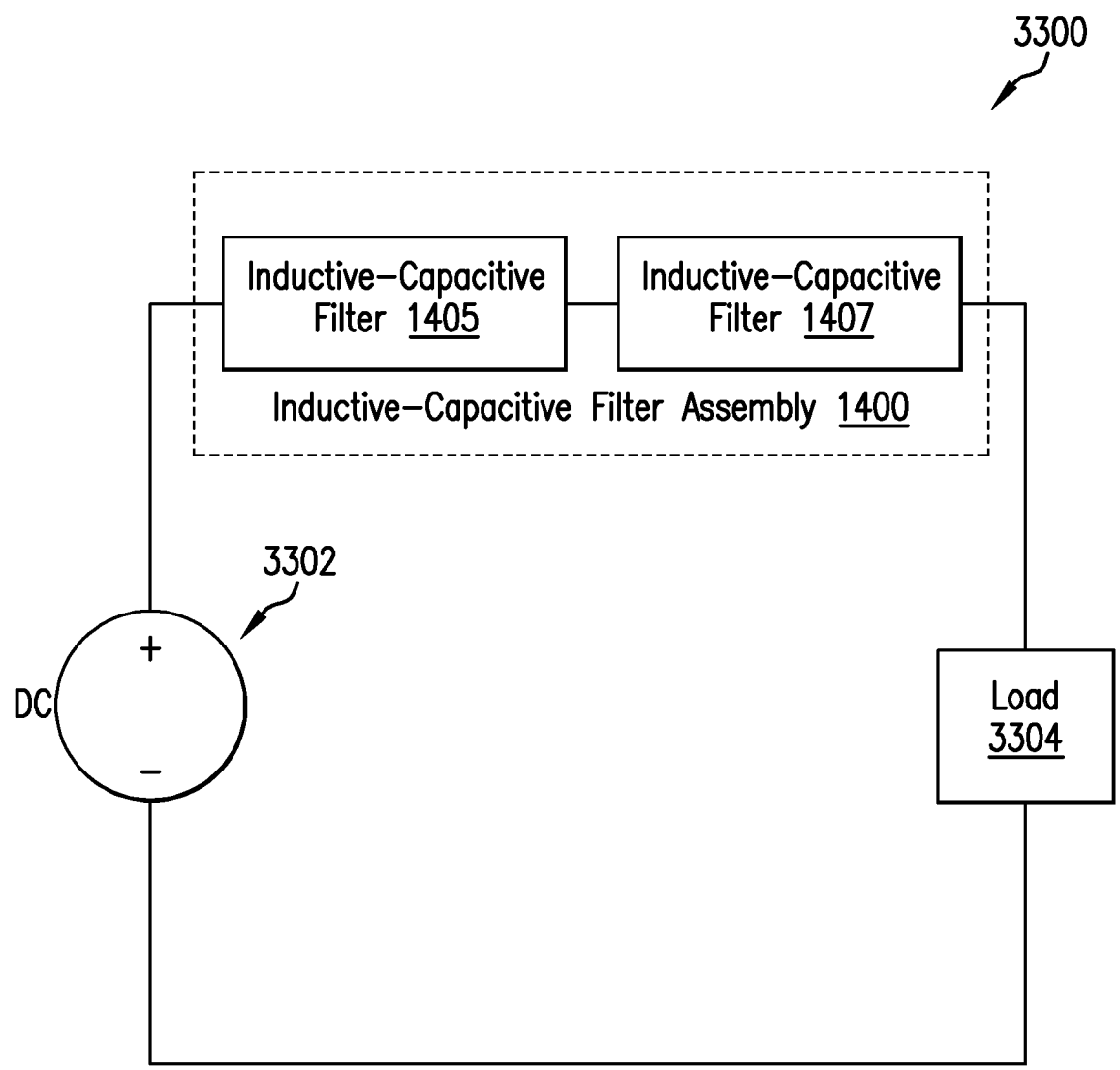
FIG. 33 illustrates an electrical circuit including an instance of the FIG. 14 inductive-capacitive filter assembly, according to an embodiment.

FIG. 33 illustrates an electrical circuit 3300 including an instance of inductive-capacitive filter assembly 1400, an AC electrical; power source 3302, a load 3304. First and second inductive capacitive filters 1405 and 1407 of assembly 1400 are electrically coupled in series with AC electrical power source 3302 and load 3304. Circuit 3300 is, for example, part of a semiconductor processing system. AC electrical power source 3302 may be replaced with a DC electrical power source without departing from the scope hereof.

In a particular embodiment, load 3304 is sensitive to noise from AC electrical power source 3302 having a frequency $f_1$ and noise from AC electrical power source 3302 having a frequency $f_2$. Accordingly, first inductive-capacitive filter 1405 is tuned to block transmission of signals having a frequency $f_1$, and second inductive-capacitive filter 1407 is tuned to block transmission of signals having a frequency $f_2$, in this application.

Changes may be made in the above inductive-capacitive filters, systems, and associated methods departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present filters, methods, and system, which, as a matter of language, might be said to fall there between

What is claimed is:

1. A method of forming an inductance-capacitance filter comprising:
    winding multiple turns of a first insulating-conductive strip and a second insulating-conductive strip, the first insulating-conductive strip having a first insulating strip joined with a first conductive strip and the second insulating-conductive strip having a second conductive strip and a second insulating strip, the winding of the first and second insulating-conductive strips being about a common winding axis;
    forming a first capacitance from capacitance between the multiple turns of the first insulating-conductive strip;
    forming a first inductance-capacitance resonant circuit comprising resistance of the first conductive strip, inductance of the first conductive strip, and the first capacitance; and
    coupling a first end of the first conductive strip to an input of the inductance-capacitance filter and a second end of the first conductive strip to an output of the inductance-capacitance filter.

2. The method of claim 1 further comprising:
    forming a second capacitance from capacitance between the multiple turns of the second insulating-conductive strip;
    forming a second inductance-capacitance resonant circuit comprising resistance of the second conductive strip, inductance of the second conductive strip, and the second capacitance;
    coupling a first end of the second conductive strip to the input of the inductance-capacitance filter through the first conductive strip and a second end of the first conductive strip to the output of the inductance-capacitance filter;
    the first conductive strip being coupled to the output of the inductance-capacitance filter through the second conductive strip.

3. The method of claim 2 wherein each of the first and second conductive strip comprises metallic foil and each insulating strip comprises dielectric material.

4. The method of claim 2, wherein each conductive strip has a cross-sectional area with an aspect ratio of at least 2.

5. The method of claim 2 wherein the inductance-capacitance filter has at least two resonant frequencies.

6. The method of claim 2 further comprising disposing a magnetic core material within an aperture of the wound first and second insulating-conductive strips.

7. A method of forming an inductance-capacitance filter comprising:
    layering together a first insulating-conductive strip and a second insulating-conductive strip, the first insulating-conductive strip having a first insulating strip joined with a first conductive strip and the second insulating-conductive strip having a second insulating strip joined with a second conductive strip, the first and second conductive strips separated from each other by at least one of the first and second insulating strips;
    winding multiple turns of the layered insulating-conductive strips;
    forming a first capacitance from capacitance between the multiple turns of the first and second conductive strips;
    forming an inductance-capacitance resonant circuit comprising inductance of the conductive strips, and the first capacitance; and
    coupling a first end of the first conductive strip to an input of the inductance-capacitance filter and a second end of the first conductive strip to a first output of the inductance-capacitance filter.

8. The method of claim 7 further comprising coupling a first end of the second conductive strip to the input of the inductance-capacitance filter through the first conductive strip and a second end of the first conductive strip to the output of the inductance-capacitance filter;
    the first conductive strip being coupled to the output of the inductance-capacitance filter through the second conductive strip.

9. The method of claim 8 wherein each of the first and second conductive strip comprises metallic foil and each insulating strip comprises dielectric material.

10. The method of claim 9 wherein the inductance-capacitance filter has at least two resonant frequencies.

11. The method of claim 8 further comprising disposing a magnetic core material within an aperture of the wound first and second insulating-conductive strips.

12. The method of claim 7 further comprising coupling a first end of the of the second conductive strip to the input of the inductance-capacitance filter and a second end of the second conductive strip to a second output of the inductance-capacitance filter.

13. The method of claim 12 wherein the inductance-capacitance filter has at least two resonant frequencies.

14. The method of claim 13 wherein each of the first and second conductive strip comprises metallic foil and each insulating strip comprises dielectric material.

15. The method of claim 14 further comprising disposing a magnetic core material within an aperture of the wound first and second insulating-conductive strips.

\* \* \* \* \*